(12) United States Patent
Geissler et al.

(10) Patent No.: US 11,145,563 B2
(45) Date of Patent: Oct. 12, 2021

(54) SEMICONDUCTOR DEVICES HAVING CUTOUTS IN AN ENCAPSULATION MATERIAL AND ASSOCIATED PRODUCTION METHODS

(71) Applicant: Infineon Technologies AG, Neubiberg (DE)

(72) Inventors: Christian Geissler, Teugn (DE); Walter Hartner, Bad Abbach-Peissing (DE); Claus Waechter, Sinzing (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 6 days.

(21) Appl. No.: 16/447,610

(22) Filed: Jun. 20, 2019

(65) Prior Publication Data

US 2020/0006174 A1 Jan. 2, 2020

(30) Foreign Application Priority Data

Jun. 29, 2018 (DE) .......................... 102018210755.6
May 16, 2019 (DE) .......................... 102019112940.0

(51) Int. Cl.
*H01L 23/31* (2006.01)
*H01L 21/56* (2006.01)
(Continued)

(52) U.S. Cl.
CPC .......... *H01L 23/315* (2013.01); *H01L 21/565* (2013.01); *H01L 21/6835* (2013.01);
(Continued)

(58) Field of Classification Search
CPC ... H01L 23/315; H01L 21/6835; H01L 24/11; H01L 21/565; H01L 2221/68363;
(Continued)

(56) References Cited

U.S. PATENT DOCUMENTS 6,949,405 B2  9/2005 Hagen
6,955,950 B2  10/2005 Aigner et al.
(Continued)

FOREIGN PATENT DOCUMENTS

CN  107479034 A  12/2017
DE  10200869 A1  7/2003
(Continued)

*Primary Examiner* — Robert G Bachner
(74) *Attorney, Agent, or Firm* — Harrity & Harrity LLP

(57) ABSTRACT

A method comprises providing a least one semiconductor component, wherein each of the at least one semiconductor component comprises: a semiconductor chip, wherein the semiconductor chip comprises a first main surface and a second main surface opposite the first main surface, and a sacrificial layer arranged above the opposite second main surface of the semiconductor chip. The method further comprises encapsulating the at least one semiconductor component with an encapsulation material. The method further comprises removing the sacrificial material, wherein above each of the at least one semiconductor chip a cutout is formed in the encapsulation material. The method further comprises arranging at least one lid above the at least one cutout, wherein a closed cavity is formed by the at least one cutout and the at least one lid above each of the at least one semiconductor chip.

25 Claims, 19 Drawing Sheets

(51) Int. Cl.
*H01L 21/683* (2006.01)
*H01L 23/00* (2006.01)

(52) U.S. Cl.
CPC ............ *H01L 24/11* (2013.01); *H01L 21/568* (2013.01); *H01L 2221/68363* (2013.01); *H01L 2224/111* (2013.01)

(58) Field of Classification Search
CPC ............ H01L 2224/111; H01L 21/568; H01L 23/3128; H01L 2221/68331; H01L 2224/18; H01L 24/02; H01L 24/13; H01L 2224/02379; H01L 2224/02381; H01L 2224/13024; H01L 2224/13019
See application file for complete search history.

(56) References Cited

U.S. PATENT DOCUMENTS

| | | |
|---|---|---|
| 7,234,237 B2 | 6/2007 | Franosch et al. |
| 7,635,901 B2 | 12/2009 | Robert |
| 2003/0183368 A1* | 10/2003 | Paradis ............... H01S 5/02484 165/80.3 |
| 2005/0280127 A1* | 12/2005 | Zhao ....................... H01L 23/24 257/678 |
| 2008/0278370 A1 | 11/2008 | Lachner |
| 2016/0099199 A1* | 4/2016 | Viswanathan ........ H01L 24/741 257/666 |
| 2016/0218072 A1 | 7/2016 | Liao et al. |
| 2016/0336990 A1 | 11/2016 | Petzold et al. |
| 2017/0062299 A1* | 3/2017 | Auchere ........... H01L 23/49838 |
| 2017/0221857 A1 | 8/2017 | Mahler et al. |
| 2017/0284951 A1 | 10/2017 | Pindl et al. |
| 2018/0122777 A1* | 5/2018 | Wong .................... H01L 29/20 |
| 2018/0233423 A1* | 8/2018 | Lobianco ................ H01L 24/32 |

FOREIGN PATENT DOCUMENTS

| | | |
|---|---|---|
| DE | 10246283 B3 | 3/2004 |
| DE | 10316777 A1 | 11/2004 |
| EP | 1708958 B1 | 1/2008 |

\* cited by examiner

SEMICONDUCTOR DEVICES HAVING CUTOUTS IN AN ENCAPSULATION MATERIAL AND ASSOCIATED PRODUCTION METHODS

CROSS REFERENCE TO RELATED APPLICATIONS

This application claims priority under 35 U.S.C. § 119 to German Patent Application No. 102018210755.6 filed on Jun. 29, 2018, and to German Patent Application No. 102019112940.0 filed on May 16, 2019, the contents of which are incorporated by reference herein in their entirety.

TECHNICAL FIELD

The present disclosure relates generally to semiconductor technology. Also, the disclosure relates to semiconductor devices having cutouts in an encapsulation material and to methods for producing such semiconductor devices.

BACKGROUND

In many applications, the semiconductor chips contained in semiconductor devices have to be protected against external influences. For this purpose, the semiconductor chips can be embedded in encapsulation materials, for example. The use of encapsulation materials can lead to undesired power losses during operation of the semiconductor devices. By way of example, a coupling between the encapsulation material and electromagnetic waves emitted by the semiconductor device can occur, which can lead to signal losses.

SUMMARY

Manufacturers of semiconductor devices endeavor to provide improved semiconductor devices and methods for producing such semiconductor devices. In particular, it may be desirable to provide semiconductor devices having low performance losses and methods for producing same.

One aspect of the disclosure relates to a method, comprising: providing at least one semiconductor component, wherein each of the at least one semiconductor component comprises: a semiconductor chip, wherein the semiconductor chip comprises a first main surface and a second main surface opposite the first main surface, and a sacrificial material arranged above the opposite second main surface of the semiconductor chip; encapsulating the at least one semiconductor component with an encapsulation material; removing the sacrificial material, wherein above each of the at least one semiconductor chip a cutout is formed in the encapsulation material; and arranging at least one lid above the at least one cutout, wherein a closed cavity is formed by the at least one cutout and the at least one lid above each of the at least one semiconductor chip.

A further aspect of the disclosure relates to a device, comprising: a semiconductor chip, comprising a first main surface and a second main surface opposite the first main surface; an encapsulation material, wherein the semiconductor chip is encapsulated by the encapsulation material; and a cutout arranged in the encapsulation material, wherein the cutout is arranged above the opposite main surface of the semiconductor chip, wherein in an orthogonal projection onto the opposite main surface the basic area of the cutout at least partly projects beyond the basic area of the semiconductor chip.

A further aspect of the disclosure relates to a device, comprising: a semiconductor chip, comprising a first main surface and a second main surface opposite the first main surface; an encapsulation material, wherein the semiconductor chip is at least partly encapsulated by the encapsulation material; and a cutout arranged in the encapsulation material, wherein the cutout is arranged above the opposite main surface of the semiconductor chip, wherein in a projection perpendicular to the first main surface of the semiconductor chip the basic area of the cutout is arranged above a region of the semiconductor chip and/or of the encapsulation material in which radio-frequency signals are processed or transferred.

A further aspect of the disclosure relates to a device, comprising: a semiconductor chip, comprising a first main surface and a second main surface opposite the first main surface; an encapsulation material, wherein the semiconductor chip is encapsulated by the encapsulation material; and a material arranged above the opposite main surface of the semiconductor chip, wherein in a projection perpendicular to the first main surface of the semiconductor chip the material and at least one radio-frequency region of the semiconductor chip and/or of the encapsulation material in which radio-frequency signals are processed or transferred are free of overlap.

BRIEF DESCRIPTION OF THE DRAWINGS

Semiconductor devices having cutouts in an encapsulation material and associated production methods in accordance with the disclosure are explained in greater detail below with reference to drawings. The elements shown in the drawings are not necessarily rendered in a manner true to scale relative to one another. Identical reference signs may designate identical components.

DETAILED DESCRIPTION

In the following detailed description, reference is made to the accompanying drawings, which show for illustration purposes specific aspects and implementations in which the disclosure can be implemented in practice. In this context, direction terms such as, for example, "at the top", "at the bottom", "at the front", "at the back", etc. may be used with respect to the orientation of the figures described. Since the components of the implementations described can be positioned in different orientations, the direction terms may be used for the purpose of illustration and are not restrictive in any way whatsoever. Other aspects can be used and structural or logical changes can be made, without departing from the concept of the present disclosure. That is to say that the following detailed description should not be understood in a restrictive sense.

FIGS. 1A to 1D schematically illustrate a cross-sectional side view of a method for producing a semiconductor device 100 in accordance with the disclosure. The method is illustrated in a general way in order to describe aspects of the disclosure qualitatively. The method can have further aspects, which are not illustrated in FIGS. 1A to 1D for the sake of simplicity. For example, the method can be extended by any desired aspects described in connection with other devices and methods in accordance with the disclosure.

Figure 1A:
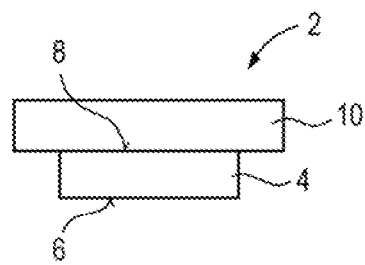
FIGS. 1A to 1D schematically illustrate a cross-sectional side view of a method for producing a semiconductor device 100 in accordance with the disclosure.

In FIG. 1A, at least one semiconductor component 2 is provided. In the example in FIG. 1A, only a single semiconductor component 2 is shown for the sake of simplicity. In further examples, the number of semiconductor components 2 can deviate and be chosen as desired. Each of the at least one semiconductor component 2 comprises a semiconductor chip 4, wherein the semiconductor chip 4 comprises a first main surface 6 and a second main surface 8 opposite the first main surface 6. Furthermore, each of the at least one semiconductor component 2 comprises a sacrificial material 10 arranged above the opposite second main surface 8 of the semiconductor chip 4.

In general, the semiconductor chip 4 can contain integrated circuits, passive electronic components, active electronic components, etc. The integrated circuits can be configured as integrated logic circuits, analog integrated circuits, integrated mixed-signal circuits, integrated power circuits, etc. The semiconductor chip 4 can be produced from an elemental semiconductor material (e.g. Si, etc.) or from a compound semiconductor material (e.g. GaN, SiC, SiGe, GaAs, etc.).

In one example, the semiconductor chip 4 can be a radio-frequency chip, such as a radar sensor chip, for example. Accordingly, the semiconductor chip 4 can operate in a radio-frequency or microwave frequency range that can generally range from approximately 10 GHz to approximately 300 GHz. By way of example, the semiconductor chip 4 can thus comprise one or more integrated radio-frequency or microwave circuits that can operate in a frequency range of greater than 10 GHz. Microwave circuits of this type can comprise, for example, microwave transmitters, microwave receivers, microwave transceivers, microwave sensors or microwave detectors. The devices described herein can be used for radar applications. Radar microwave devices can be used for example in automotive or industrial applications for distance determining/distance measuring systems. By way of example, automatic vehicle speed regulating systems or vehicle anticollision systems can operate in the microwave frequency range, e.g. at approximately 24 GHz, 77 GHz or 79 GHz.

In a further example, the semiconductor chip 4 can be a sensor chip including a sensing structure. In particular, this can be a sensor chip that requires a cavity or a cutout for its operation. A sensor chip can comprise a MEMS (microelectromechanical system), in particular, which can be integrated in the semiconductor chip 4. The MEMS can comprise one or more micromechanical structures, such as, for instance, a bridge, a membrane, a cantilever, a reed structure, etc. The MEMS can be designed to sense a physical variable, for example pressure, temperature, air humidity, etc. Examples of sensors are pressure sensors, tire pressure sensors, gas sensors, air humidity sensors, etc.

The semiconductor chip 4 can comprise one or more electronic structures, which can be arranged on or near a main surface of the semiconductor chip 4. Such a main surface may be referred to hereinafter as active main surface. In one example, the electronic structures can be electrical contacts (or contact electrodes or contact pads). In a further example, the electronic structures can be electronic elements that can generate electromagnetic radiation. For example, an antenna of a radar chip can transmit or receive electromagnetic waves in the frequency ranges mentioned above. In contrast to an active main surface of the semiconductor chip 4, a main surface without an additional electronic structure may be referred to as inactive main surface. An inactive main surface can thus be formed merely by the semiconductor material of the semiconductor chip 4 or, for example, a passivation layer arranged there-above. Often, an active main surface of a semiconductor chip is referred to as front side and an inactive main surface of the semiconductor chip is referred to as rear side. In the example in FIGS. 1A to 1D, the first main surface 6, in particular, can be an active main surface of the semiconductor chip 4.

The sacrificial material 10 can be designed to be removed in a later process (See FIG. 1C). In particular, the sacrificial material 10 can be any suitable etchable material. The sacrificial material 10 can comprise a semiconductor material, which may or may not be identical to the semiconductor material of the semiconductor chip 4. By way of example, the sacrificial material 10 can be present in the form of a silicon layer or a silicon wafer. In this case, etching the sacrificial material 10 can be carried out using wet-chemical media, for example potassium hydroxide solution (KOH etching). In this case, by way of example, silicon oxide ($SiO_2$) can be used as etch stop layer (not shown). The sacrificial material 10 can comprise a glass material. By way of example, the sacrificial material 10 can be present in the form of a glass layer or a glass wafer. In this case, etching the sacrificial material 10 can be carried out using hydrofluoric acid (HF etching). By way of example, silicon nitride (SiN) can be used here as etch stop layer. In a further example, the sacrificial material 10 can comprise a (e.g. etchable) plastic. In yet another example, the sacrificial material 10 can comprise a (e.g. etchable) metal. As can be discerned in FIG. 1A, a basic area of the sacrificial material 10 can extend beyond a basic area of the semiconductor chip 4, wherein a region extending laterally with respect to the semiconductor chip 4 and below the sacrificial material 10 is kept free of material.

Figure 1B:
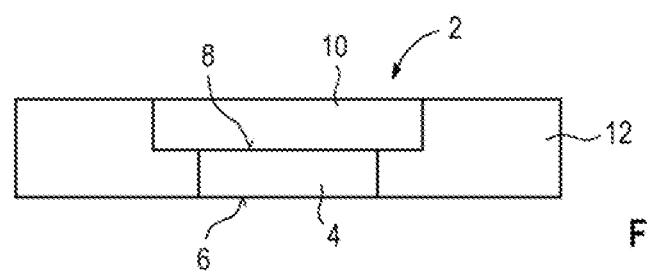

In FIG. 1B, the at least one semiconductor component 2 is encapsulated with an encapsulation material 12. In the example in FIG. 1B, during the process of encapsulating the semiconductor component 2, at least the sidewalls of the semiconductor component 2 or of the semiconductor chip 4 and of the sacrificial material 10 can be covered by the encapsulation material 12. In example implementations, all sidewalls of the semiconductor chip 4 and/or all sidewalls of the sacrificial material 10 can be covered by the encapsulation material 12. In this case, the encapsulation material 12 can contact the semiconductor component 2, in particular. In other words, the semiconductor component 2 can be embedded into the encapsulation material 12, such that the latter may also be referred to as embedding material. As can be discerned in FIG. 1B, a main surface of the sacrificial material 10 can be exposed, e.g. not be covered by any material, after the process of embedding the semiconductor component 2. In a further example, in addition, the upper main surface of the sacrificial material 10 can be covered by the encapsulation material 12 and can contact the latter. In such a case, in a later process (not shown), the encapsulation material 12 can be partly removed again in order to expose the upper main surface of the sacrificial material 10. By way of example, the encapsulation material 12 can be removed here using a grinding process and/or chemical mechanical polishing (CMP). Furthermore, it can be discerned in FIG. 1B that the encapsulation material 12 extends laterally with respect to the semiconductor chip 4 and below the sacrificial material 10 in the region which, before the encapsulating process, was exposed as explained with reference to FIG. 1A. The encapsulation material 12 thus connects a region of the main surface of the sacrificial material 10 to a lateral surface of the semiconductor chip 4.

In general, the encapsulation material 12 can be any desired material used as encapsulation material in the production of semiconductor packages (or semiconductor housings or packaged semiconductor chips). In one example, the encapsulation material 12 can be a molding material into which the semiconductor component 2 can be embedded, wherein at least the side surfaces of the semiconductor component 2 can be covered by the molding material. The molding material or the molding compound can be designed to be used in the context of a molding method, for example: compression molding, injection molding, powder molding, liquid molding, etc. The molding material can comprise for example at least one from an epoxy, a filled epoxy, a glass-fiber-filled epoxy, an imide, a thermoplastic, a thermosetting polymer, a polymer mixture.

In a further example, the encapsulation material 12 can be a glass material. The glass material can comprise for example one or more from the following: silicate glass, photosensitive glass, float glass, soda-lime glass, borosilicate glass, alkali-free glass, low Tg glass, etc. The glass material can be heated above its glass transition temperature and undergo transition to a viscous state in the process. The semiconductor component(s) 2 can then be embedded in the liquid glass material, after which the glass material can cool down again below its glass transition temperature.

Figure 1C:
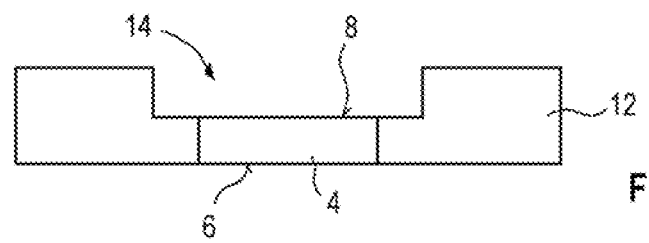

In FIG. 1C, the sacrificial material 10 is removed, wherein above each of the at least one semiconductor chip 4 a cutout 14 is formed in the encapsulation material 12. In particular, the sacrificial material 10 can be removed using an etching process, such as has already been described in connection with FIG. 1B. The sacrificial material 10 can be removed in such a way that materials lying below the sacrificial material 10 are exposed. By way of example, an optional etch stop layer (not shown) lying below the sacrificial material 10 or the opposite main surface 8 of the semiconductor chip 4 can be exposed. As can be discerned in FIG. 1C, the exposed area can be composed partly of a surface of the semiconductor chip 4 and partly of a surface of the encapsulation material 12. The geometric shape of the cutout 14 produced can be dependent on and correspond to the geometric shape of the sacrificial material 10, in particular. One possible shape of the cutout 14 will be discussed in association with FIGS. 2A and 2B. Since the active main surface 6, as shown in FIG. 1C, is arranged on the side facing away from the sacrificial material, the etching process for removing the sacrificial material does not adversely affect the active structures of the semiconductor chip 4.

Figure 1D:
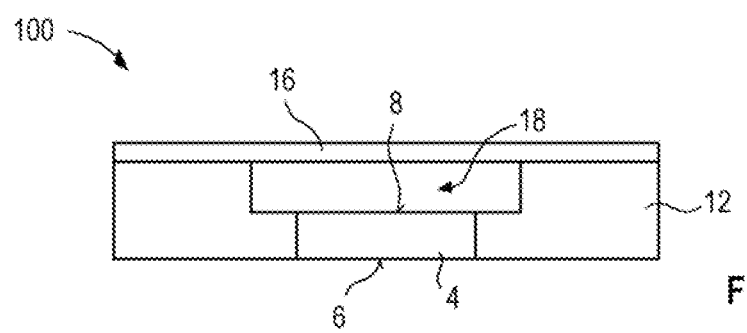

In FIG. 1D, at least one lid 16 is arranged above the at least one cutout 14, wherein a closed cavity 18 is formed by the at least one cutout 14 and the at least one lid 16 above each of the at least one semiconductor chip 4. The lid 16 can be produced from one of the following materials depending on the functionality of the semiconductor device 100 to be produced: molding material, metal, glass, semiconductor material, in particular silicon. The lid 16 can be connected to the encapsulation material 12. By way of example, the lid 16 can be adhesively bonded to the encapsulation material 12.

In one example, the cavity 18 can be formed by the cutout 14 and the lid 16 alone. In a further example, the cavity 18 can be formed by the cutout 14, the lid 16 and further components. In this case, the further components can be arranged between the cutout 14 and the lid 16, in particular. In one example, the cavity 18 can be hermetically sealed. In a further example, the cavity 18 can have an opening (not shown). By way of example, such an opening in the case of a sensor chip can provide a connection used for the functioning of the sensor chip between the sensor chip and the environment outside the cavity 18.

In one example, the cavity 18 can contain air. In a further example, the cavity 18 can contain a vacuum, in particular for the case of a sensor chip comprising a MEMS. In a further example, the cavity 18 can contain a protective gas, a filling gas or a functional gas. In yet another example, the cavity 18 can be partly or completely filled with a liquid or solid material. The material filling the cavity 18 can have, in particular, good filling properties and/or a dielectric constant that is less than the dielectric constant of the semiconductor material of the semiconductor chip 4 and/or less than the dielectric constant of the encapsulation material 12.

Figure 2A:
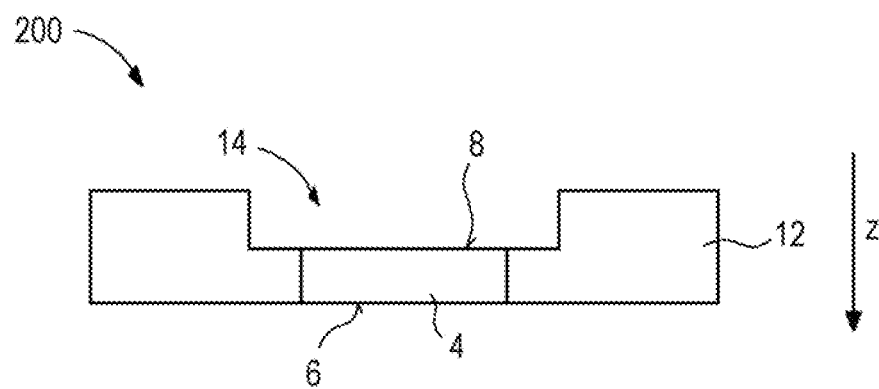
FIGS. 2A and 2B schematically show a cross-sectional side view and a plan view of a semiconductor device 200 in accordance with the disclosure.
Figure 2B:
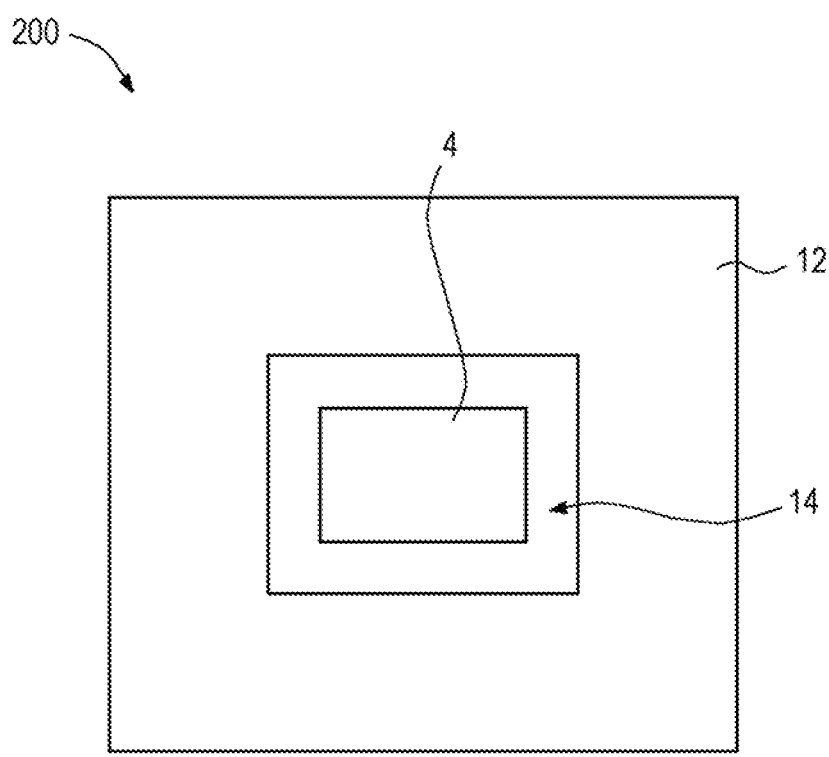

FIGS. 2A and 2B, which schematically show a cross-sectional side view and a plan view of a semiconductor device 200 in accordance with the disclosure. The semiconductor device 200 is illustrated in a general way in order to describe aspects of the disclosure qualitatively. The semiconductor device 200 can have further aspects, which are not illustrated in FIGS. 2A and 2B for the sake of simplicity. For example, the semiconductor device 200 can be extended by any desired aspects described in connection with other devices and methods in accordance with the disclosure.

The semiconductor device 200 comprises a semiconductor chip 4 having a first main surface 6 and a second main surface 8 opposite the first main surface 6. The semiconductor device 200 furthermore comprises an encapsulation material 12, wherein the semiconductor chip 4 is encapsulated by the encapsulation material 12. The semiconductor device 200 furthermore comprises a cutout 14 arranged in the encapsulation material 12, wherein the cutout 14 is arranged above the opposite main surface 8 of the semiconductor chip 4. In an orthogonal projection onto the opposite main surface 8, the basic area of the cutout 14 at least partly projects beyond the basic area of the semiconductor chip 4. In this case, the orthogonal projection can be effected in particular along the z-axis shown in FIG. 2A.

In the example in FIG. 2A, the basic areas of the semiconductor chip 4 and of the cutout 14 are illustrated in each case as rectangular. In further examples, the basic areas can also have some other geometric shape. In particular, the basic area of the cutout 14 need not necessarily be rectangular, but rather can have any other shape, for example circular, elliptic, triangular, etc. In the example in FIGS. 2A and 2B, the basic area of the semiconductor chip 4 is contained completely in the basic area of the cutout 14 (see FIG. 2B). That is to say that in the orthogonal projection the basic area of the cutout 14 projects beyond the basic area of the semiconductor chip 4 along the entire contour. In further examples, the basic area of the cutout 14 can also project only partly beyond the basic area of the semiconductor chip 4. In the case of a semiconductor chip 4 having a rectangular basic area, the basic area of the cutout 14 can project beyond one side, beyond two sides, beyond three sides or beyond four sides of the basic area of the semiconductor chip 4.

The semiconductor device 200 can furthermore comprise a lid (not shown), wherein a closed cavity is formed by the cutout 14 and the lid, as is illustrated in FIG. 1D, for example. In the orthogonal projection onto the opposite main surface 8 of the semiconductor chip 4, accordingly the basic area of the cavity then at least partly projects beyond the basic area of the semiconductor chip 4.

In accordance with the disclosure, the material, such as e.g. air, situated in the cavity 18 (see FIG. 1D) or the cutout 14 (see FIGS. 1C and 2A) can have a lower dielectric constant than the encapsulation material 12. As a result, it is possible to prevent a coupling between the encapsulation material 12 and electromagnetic radiation that can be generated by electronic structures of the semiconductor chip 4. By way of example, the semiconductor chip 4 can be a radar sensor chip having, for example, radio-frequency leads to an antenna or the antenna itself on an active main surface. The reduced coupling between the encapsulation material 12 and the electromagnetic radiation makes it possible to counteract a loss of quality of the signals transmitted and received by the antenna. By way of example, if the basic area of the semiconductor chip 4 is completely contained in the basic area of the cutout 14, then redistribution structures extending over the semiconductor chip 4 can also carry radio-frequency electromagnetic signals with little coupling.

Besides the reduced performance losses, the semiconductor devices according to the implementation have a thickness or mechanical stability great enough to withstand diverse mechanical and environment-dictated forces. Forces of this type can occur for example during encapsulation processes, during further treatment/processing processes of the semiconductor device (unit handling), during surface mounting of the semiconductor device, during operation of the semiconductor device, etc.

Figure 3A:
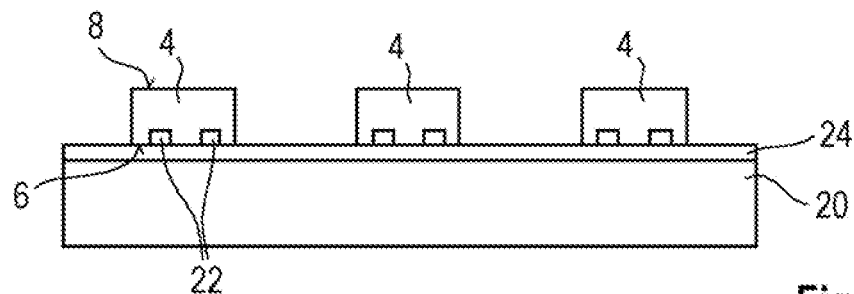
FIGS. 3A to 3O schematically illustrate a cross-sectional side view of a method for producing semiconductor devices 300 in accordance with the disclosure.
Figure 3B:
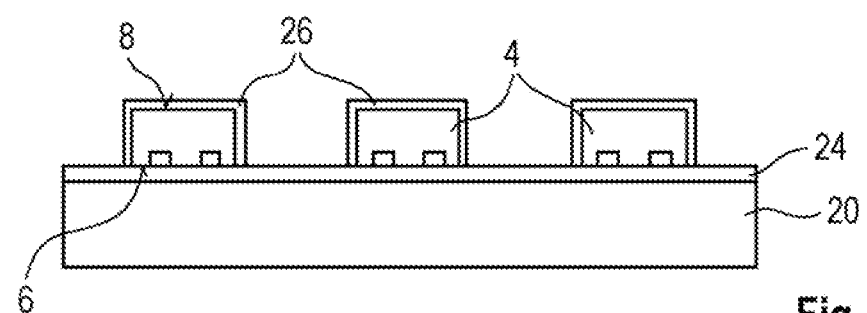
Figure 3C:
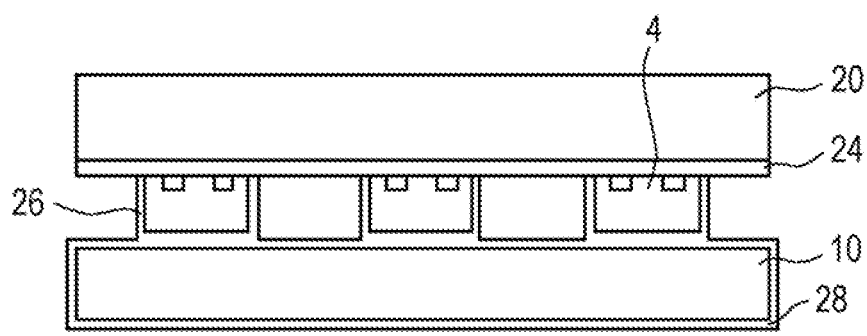
Figure 3D:
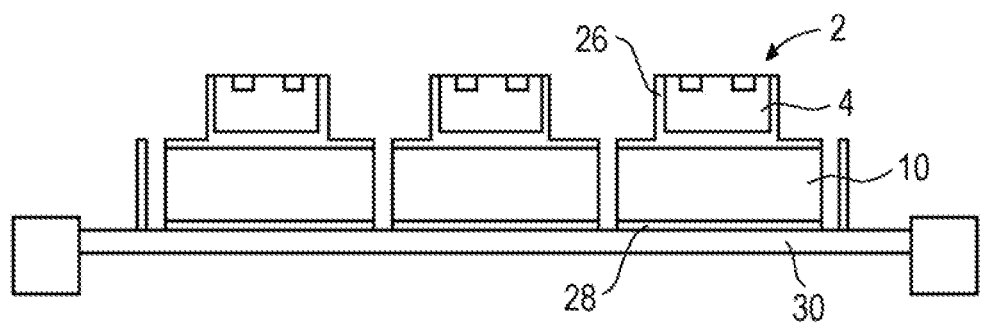
Figure 3E:
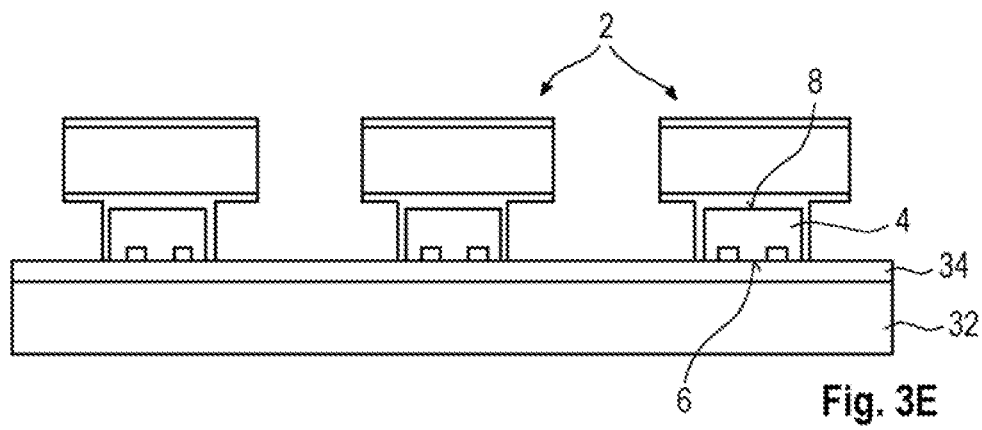
Figure 3F:
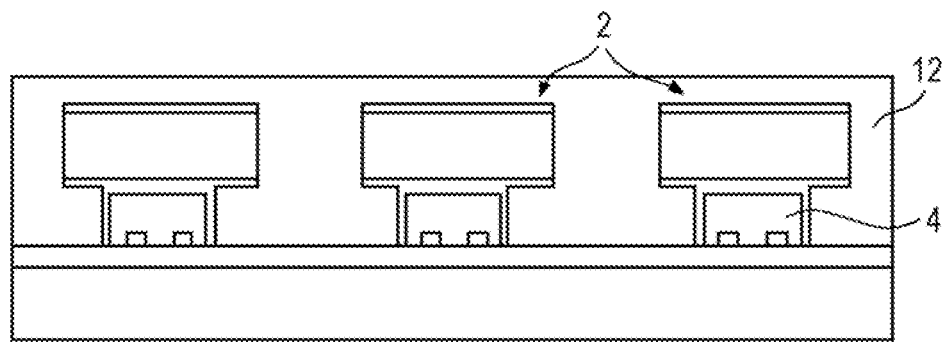
Figure 3G:
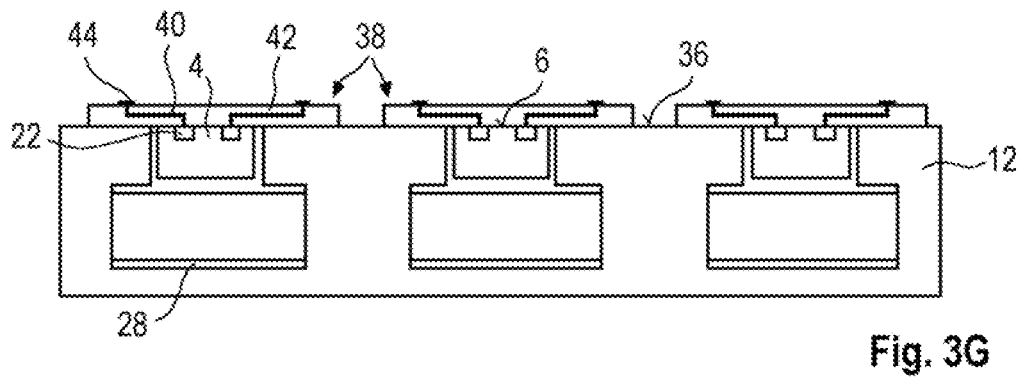
Figure 3H:
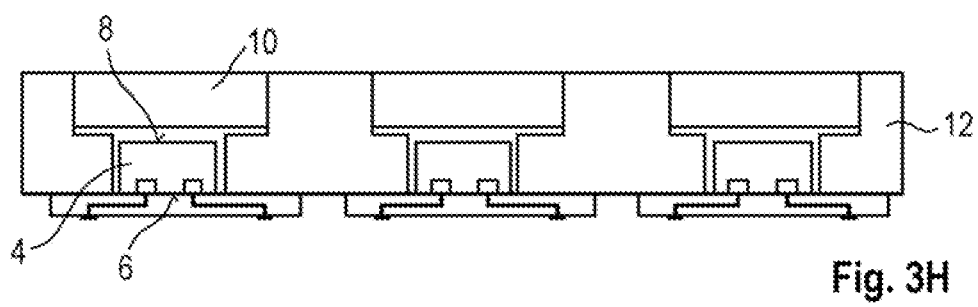
Figure 3I:
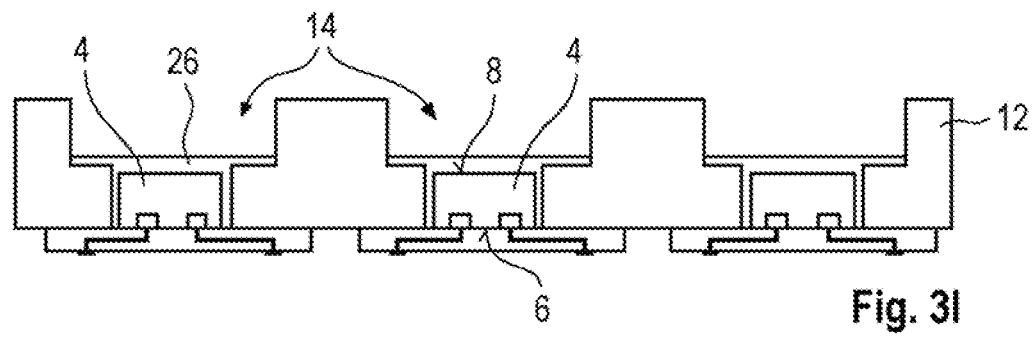
Figure 3J:
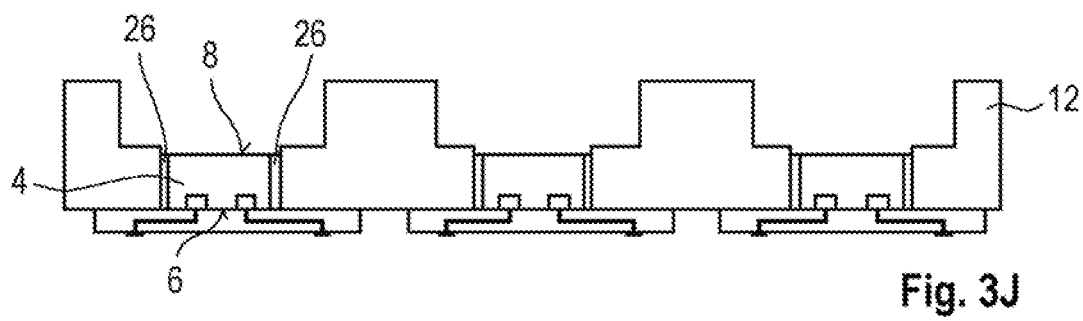
Figure 3K:
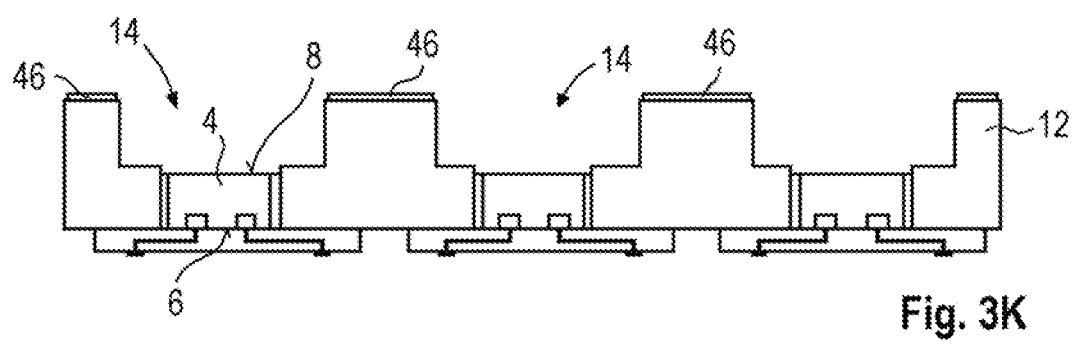
Figure 3L:
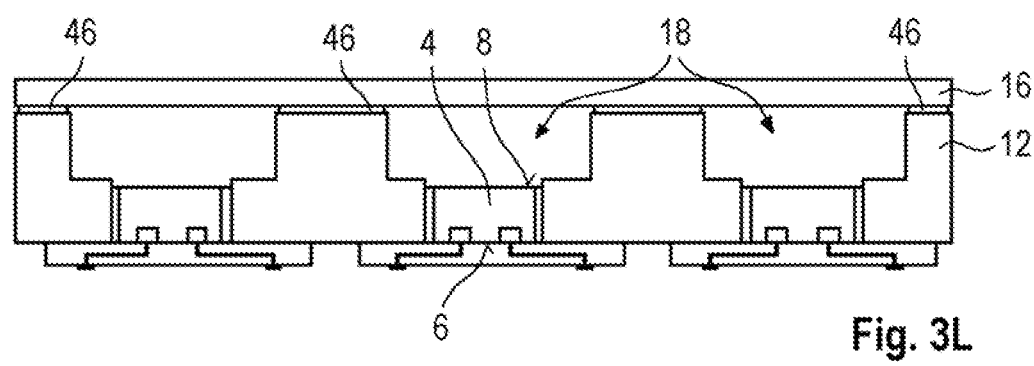
Figure 3M:
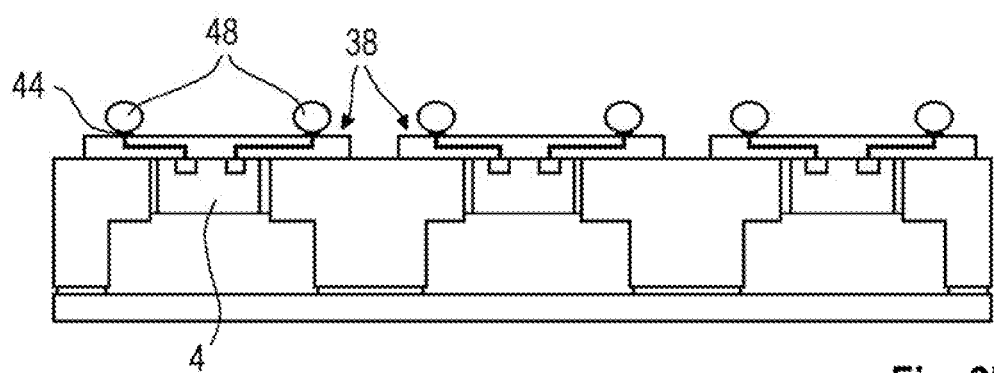
Figure 3N:
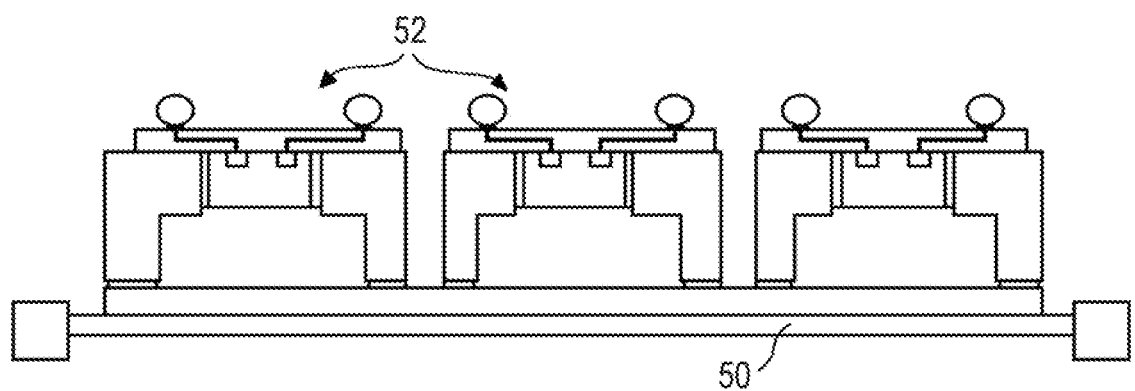
Figure 3O:
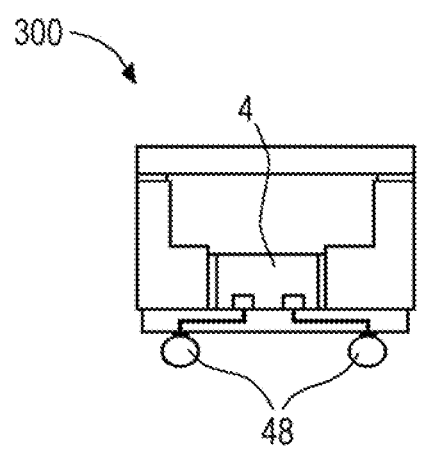

FIGS. 3A to 3O schematically illustrate a cross-sectional side view of a method for producing semiconductor devices 300 in accordance with the disclosure. The method in FIGS. 3A to 3O can be regarded as a more comprehensive implementation of the method in FIGS. 1A to 1D. That is to say that the method illustrated in FIGS. 1A to 1D can be extended by any desired aspects of the method in FIGS. 3A to 3O.

In FIG. 3A, a plurality of semiconductor chips 4 can be arranged at a distance from one another on a carrier 20. Three semiconductor chips 4 are shown in example in FIG. 3A. In further examples, the number of semiconductor chips 4 can be chosen differently in any manner desired. The semiconductor chips 4 each have a first main surface 6 and an opposite second main surface 8. In the example in FIG. 3A, the first main surfaces 6 can be active main surfaces of the semiconductor chips 4, on or near which electronic structures 22 can be arranged. The semiconductor chips 4 can be positioned on the carrier 20 using a pick-and-place method, for example. In order to fix the semiconductor chips 4 on the carrier 20, a double-sided adhesive film 24 can optionally be arranged between the semiconductor chips 4 and the carrier 20.

In FIG. 3B, an etch stop layer 26 can be deposited above the semiconductor chips 4. In the example in FIG. 3B, the etch stop layer 26 covers the side surfaces and the opposite second main surfaces 8 of the semiconductor chips 4. In further examples, the etch stop layer 26 can at least partly be deposited on the carrier 20 or the adhesive film 24. The material of the etch stop layer 26 can be dependent, in particular, on an etching method chosen later for removing a sacrificial material. If the sacrificial material is silicon, etching the sacrificial material can be carried out using potassium hydroxide solution (KOH etching). In this case, the etch stop layer 26 can include silicon oxide ($SiO_2$), for example, and can be deposited by plasma oxidation, for example. The silicon oxide can be a thermal oxide that can be deposited using thermal oxidation of silicon. It should be noted in this context that the deposition of a thermal oxide is possible, in particular, if the oxidation is carried out before the semiconductor chips 4 are adhesively bonded onto the carrier 20. The temperatures of a thermal oxidation can be greater than 700° C., which can be problematic in the case of a carrier with adhesive-bonding connection. As an alternative to plasma oxidation described above, the etch stop layer 26 can also be deposited in the form of a CVD oxide. If the sacrificial material is a glass material, etching the sacrificial material can be carried out using hydrofluoric acid (HF etching). In this case, the etch stop layer 26 can be fabricated from silicon nitride (SiN), for example.

In FIG. 3C, a sacrificial material 10 coated with a layer 28 is provided. The sacrificial material 10 can be, for example, one of the following materials: semiconductor material, in particular silicon, glass material, plastic, metal. The layer 28 can include the same material as the etch stop layer 26. In FIG. 3C, the carrier 20 with the semiconductor chips 4 arranged thereon can be turned over and connected to the coated sacrificial material 10. In one example, the etch stop layer 26 and the layer 28 can each include an oxide and a connection can be effected using oxide-oxide bonding. In further examples, a connection between the sacrificial material 10 and the semiconductor chips 4 can also be achieved using anodic bonding (e.g. glass-silicon bonding) or direct bonding (e.g. silicon-silicon bonding).

In FIG. 3D, the carrier 20 and the adhesive film 24 can be removed and the sacrificial material 10 with the semiconductor chips 4 arranged thereon can be arranged on a carrier 30. The sacrificial material 10 with the semiconductor chips 4 arranged thereon can be singulated into a plurality of semiconductor components 2. This is done by separating or removing the sacrificial material 10 in regions between respective semiconductor chips 4. In this context, by way of example, a plasma dicing process, a mechanical ultrasonic dicing process and/or a laser dicing process can be used. Each of the singulated semiconductor components 2 comprises a semiconductor chip 4 having a part of the sacrificial material 10 and parts of the layers 26 and 28.

In FIG. 3E, a plurality of the semiconductor components 2 can be arranged above a carrier 32. Three semiconductor components 2 are shown in the example in FIG. 3E. In further examples, the number of semiconductor components 2 can be chosen differently in any manner desired. The semiconductor components 2 can be arranged on the carrier 32 such that the active main surfaces 6 of the semiconductor chips 4 face the carrier 32. The semiconductor components 2 can be positioned on the carrier 32 using a pick-and-place method, for example. In order to fix the semiconductor components 2 on the carrier 32, a double-sided adhesive film 34 can optionally be arranged between the semiconductor components 2 and the carrier 32.

In FIG. 3F, the semiconductor components 2 can be encapsulated by an encapsulation material 12. In the example in FIG. 3F, the semiconductor components 2 can be embedded in a molding material, for example, wherein the side surfaces and the upper main surfaces of the semiconductor components 2 can be covered by the molding material.

In FIG. 3G, the carrier 32 and the adhesive film 34 can be removed. After removal, the active main surfaces 6 of the semiconductor chips 4 and a main surface 36 of the encapsulation material 12 can lie in particular in a common plane. Afterward, one or more redistribution layers 38 can be formed above the active main surfaces 6 of the semiconductor chips 4 and the main surface 36 of the encapsulation material 12. In the example in FIG. 3G, a separate redistribution layer 38 is formed above each of the semiconductor components 2. In further examples, the redistribution layers 38 or the components thereof can also extend over a plurality of the semiconductor components 2.

The redistribution layer 38 can contain one or more conductor tracks 40 in the form of metal layers or metal tracks, which can extend substantially parallel to the active main surfaces 6 of the semiconductor chips 4. The conductor tracks 40 can fulfil the function of redistribution wiring, or redistribution, in order to electrically couple electrical contacts 44 arranged on the redistribution layer 38 to the electronic structures 22 (such as e.g. electrical contacts) of the semiconductor chips 4. In other words, the conductor tracks 40 can be designed to make the electrical structures 22 or contacts of the semiconductor chips 4 available at other positions of the semiconductor device to be produced. A multiplicity of dielectric layers 42 can be arranged between a multiplicity of conductor tracks 40 in order to electrically isolate the conductor tracks 40 from one another. Furthermore, metal layers arranged on different planes can be electrically connected to one another by a multiplicity of plated-through holes (or vias).

In FIG. 3H, the encapsulation material 12 can be at least partly removed above the opposite main surfaces 8 of the semiconductor chips 4 embedded in the encapsulation material 12. The layer 28 and parts of the sacrificial material 10 can additionally be removed in the process. By way of example, a grinding process and/or chemical mechanical polishing (CMP) can be used in this context. As a result of removing the encapsulation material 12, the sacrificial material 10 can be at least partly exposed. In the example in FIG. 3H, the upper main surface of the sacrificial material 10 and the upper main surface of the encapsulation material 12 can be situated in a common plane after the process of removing the encapsulation material 12.

In FIG. 3I, the sacrificial material 10 can be at least partly removed, wherein above the opposite main surfaces 8 of the semiconductor chips 4 cutouts 14 can be formed in the encapsulation material 12. By way of example, the sacrificial material 10 can be removed using an etching process that can be stopped by the etch stop layer 26. The etch stop layer 26 can be at least partly exposed in the process. In the example in FIG. 3I, the sacrificial material 10 can be completely removed. In further examples, a residue of the sacrificial material 10 can remain above the main surfaces 8 of the semiconductor chips 4.

In FIG. 3J, the etch stop layer 26 can be at least partly removed above the opposite main surfaces 8 of the semiconductor chips 4, wherein the opposite main surfaces 8 of the semiconductor chips 4 can be at least partly exposed. In the example in FIG. 3J, the etch stop layer 26 can be completely removed above the opposite main surfaces 8 of the semiconductor chips 4. In further examples, a residue of the etch stop layer 26 can remain above the opposite main surfaces 8 of the semiconductor chips 4. In particular, parts of the etch stop layer 26 can remain at the sidewalls of the semiconductor chips 4.

In FIG. 3K, a connecting material 46, such as e.g. an adhesive, can be deposited on parts of the encapsulation material 12. By way of example, a printing or dispensing process can be used for the deposition. In the example in FIG. 3K, the connecting material 46 can be deposited on the parts of the encapsulation material 12 which form the sidewalls of the cutouts 14.

In FIG. 3L, at least one lid 16 can be arranged above the cutouts 14. In the example in FIG. 3L, a single lid 16 can be arranged above the cutouts 14. In further examples, a plurality of lids 16 can be arranged, wherein each lid 16 can cover any desired number of the cutouts 14. A closed cavity 18 can be formed by the respective cutout 14 and the lid 16 above each of the semiconductor chips 4. In this case, the cavity 18 can be arranged above the opposite main surface 8 of the respective semiconductor chip 4. In an orthogonal projection onto the opposite main surface 8, a basic area of the cutout 14 or of the cavity 18 can at least partly project beyond a basic area of the semiconductor chip 4, as has already been discussed in association with FIGS. 2A and 2B. In the example in FIG. 3L, the basic areas of the semiconductor chip 4 and of the cavity 18 can be formed for example as shown in FIG. 2B.

In the example in FIG. 3L, the lid 16 can be secured to the encapsulation material 12 by way of the connecting material 46. In further examples, the lid 16 and the encapsulation material 12 can be connected to one another in some other suitable way. The lid 16 can be fabricated from one of the following materials depending on the functionality of the semiconductor device to be produced: molding material, metal, glass, semiconductor material, in particular silicon.

In FIG. 3M, external electrical contact elements 48 can be arranged on the electrical contacts 44 of the redistribution layer 38. By way of example, the contact elements 48 can be solder balls or solder deposits. The respective semiconductor chip 4 can thus be electrically contacted from outside the encapsulation materials 12 by way of the contact elements 48, the electrical contacts 44 and the redistribution layer 38.

In FIG. 3N, the arrangement from FIG. 3M can be arranged on a carrier 50. The semiconductor components 2 embedded into the encapsulation material 12 can be singulated into a plurality of semiconductor packages 52. By way of example, a plasma dicing process, a mechanical ultrasonic dicing process and/or a laser dicing process can be used in this context.

FIG. 3O shows a produced semiconductor device 300 in the form of a semiconductor package 52. The semiconductor package 52 can be a fan-out wafer level package, in particular, wherein the external electrical contact elements 48 are fanned out in comparison with the electronic contacts 22 of the semiconductor chip 4 on account of the redistribution layer 38 used.

FIGS. 4A to 4H schematically illustrate a cross-sectional side view of a method for producing semiconductor devices 400 in accordance with the disclosure. The method in FIGS. 4A to 4H can be regarded as a more comprehensive implementation of the method in FIGS. 1A to 1D. That is to say that the method illustrated in FIGS. 1A to 1D can be extended by any desired aspects of the method in FIGS. 4A to 4H.

Figure 4A:
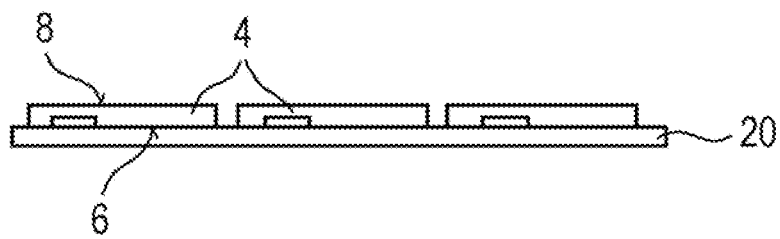
FIGS. 4A to 4H schematically illustrate a cross-sectional side view of a method for producing semiconductor devices 400 in accordance with the disclosure.

In FIG. 4A, a plurality of semiconductor chips 4 can be arranged on a carrier 20, wherein active first main surfaces 6 of the semiconductor chips 4 can face the carrier 20. In the example in FIG. 4A, the semiconductor chips 4 can be positioned individually on the carrier 20. In a further example, a semiconductor wafer comprising the plurality of semiconductor chips 4 can be arranged on the carrier 20 and subsequently be singulated into the plurality of semiconductor chips 4. Furthermore, the semiconductor chips 4 or the semiconductor wafer on the carrier 20 can be thinned by material being removed from the second main surfaces 8 of the semiconductor chips 4. By way of example, a DBG (dicing before grinding) technique can be employed in association with the processes mentioned.

Figure 4B:
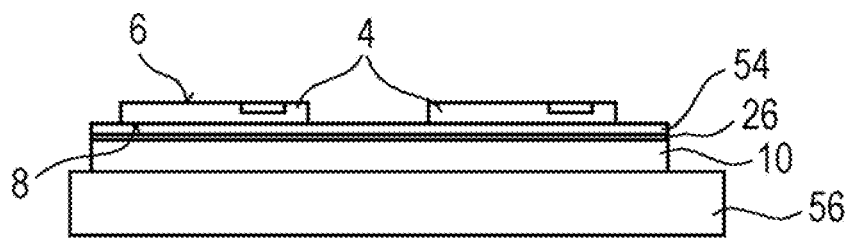

In FIG. 4B, the carrier 20 can be removed and the semiconductor chips 4 can be arranged on a sacrificial material 10. In the example in FIG. 4B, the active main surfaces 6 of the semiconductor chips 4 here can face away from the sacrificial material 10. An optional adhesive layer 54 and an etch stop layer 26 can be arranged between the semiconductor chips 4 and the sacrificial material 10. The sacrificial material 10 with the semiconductor chips 4 arranged thereon can be arranged on a further carrier 56 and be singulated using a suitable dicing process (not shown).

Figure 4C:
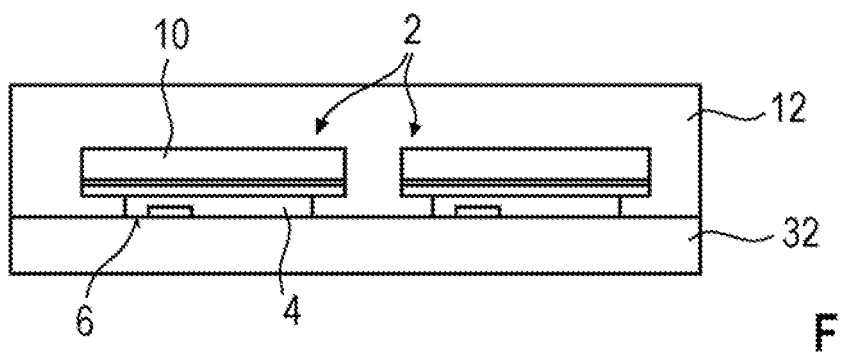

In FIG. 4C, the singulated semiconductor components 2 can be arranged on a carrier 32, wherein the active main surfaces 6 of the semiconductor chips 4 can face the carrier 32. The carrier 32 can be a metal carrier, in particular. In a further process, the semiconductor components 2 can be encapsulated by an encapsulation material 12.

Figure 4D:
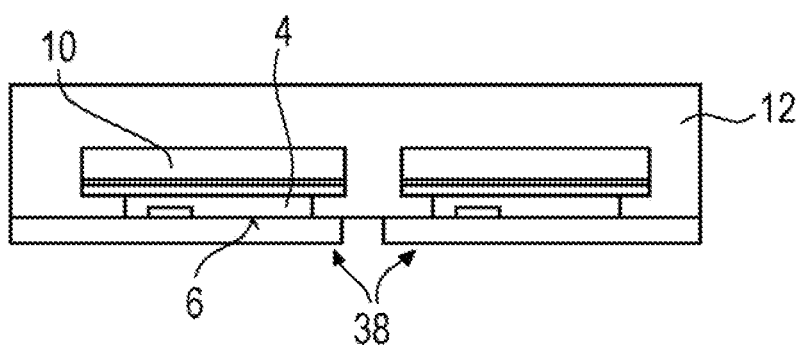
Figure 4E:
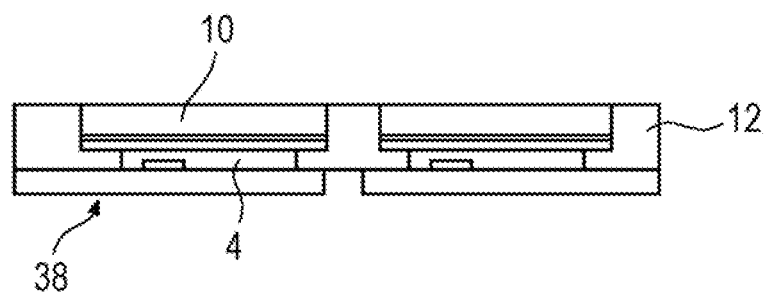
Figure 4F:
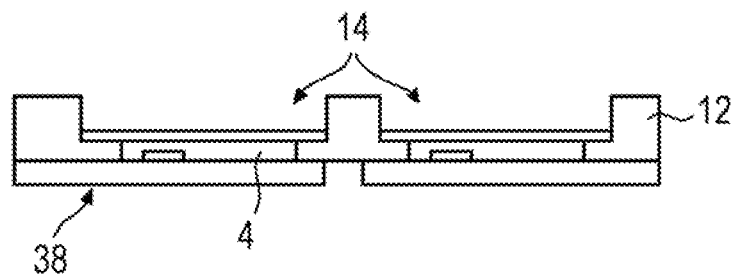
Figure 4G:
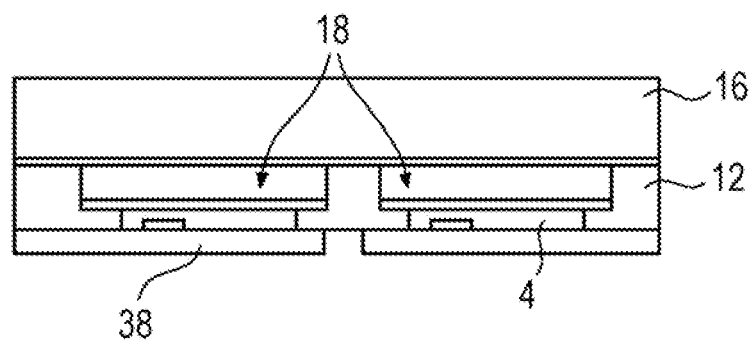
Figure 4H:
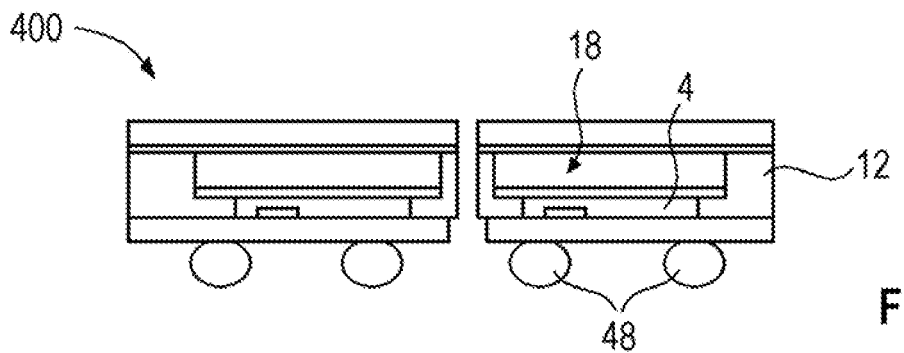
Figure 5A:
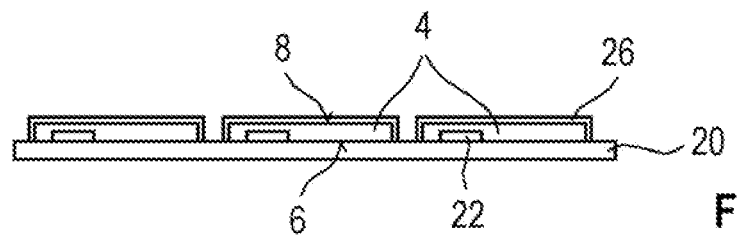
FIGS. 5A to 5I schematically illustrate a cross-sectional side view of a method for producing semiconductor devices 500 in accordance with the disclosure.
Figure 5B:
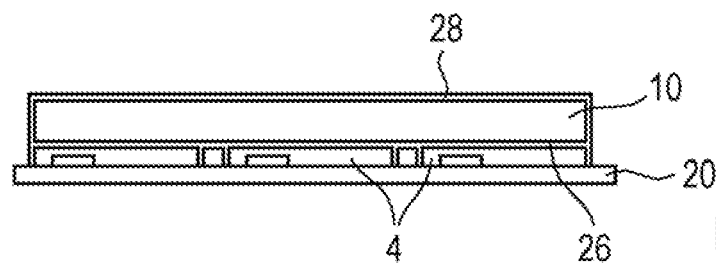
Figure 5C:
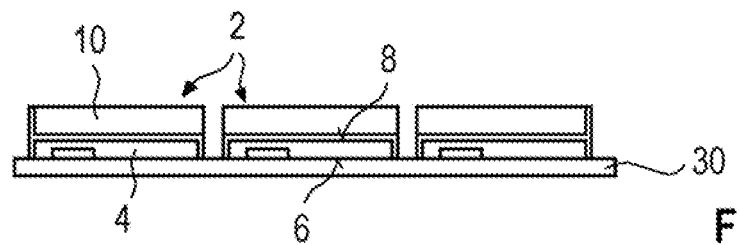
Figure 5D:
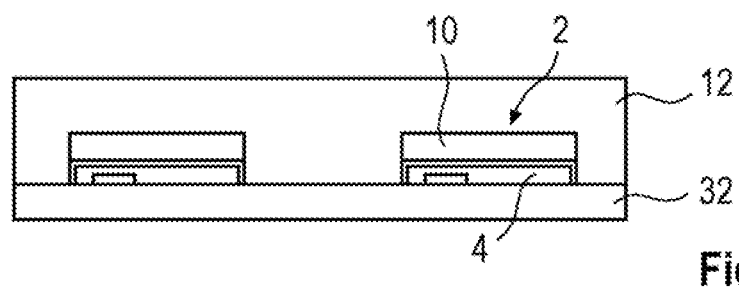
Figure 5E:
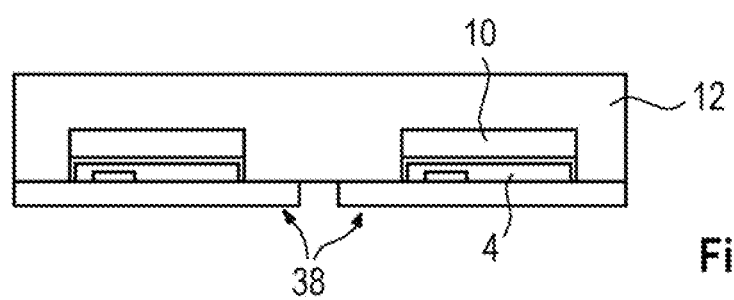
Figure 5F:
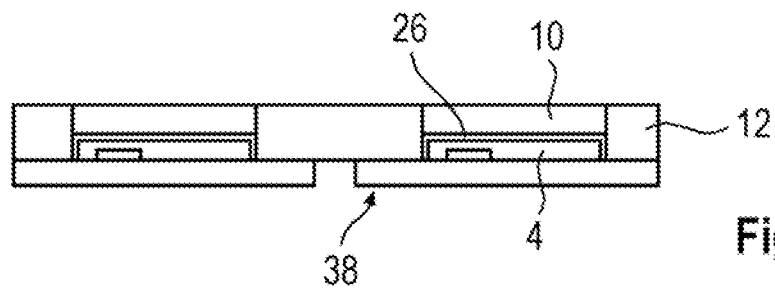
Figure 5G:
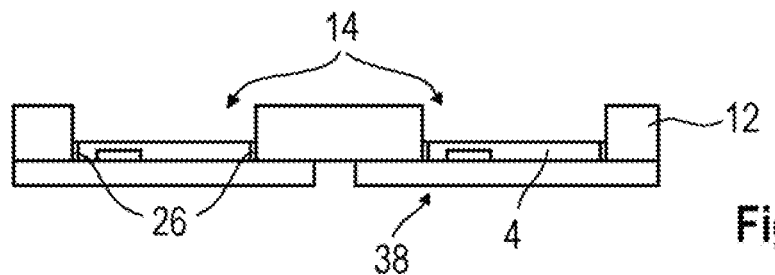
Figure 5H:
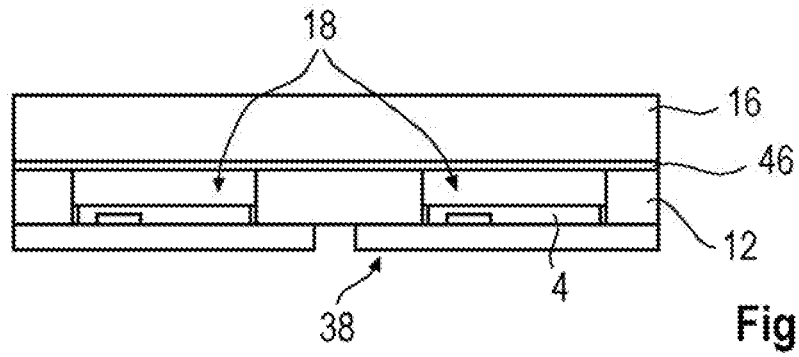
Figure 5I:
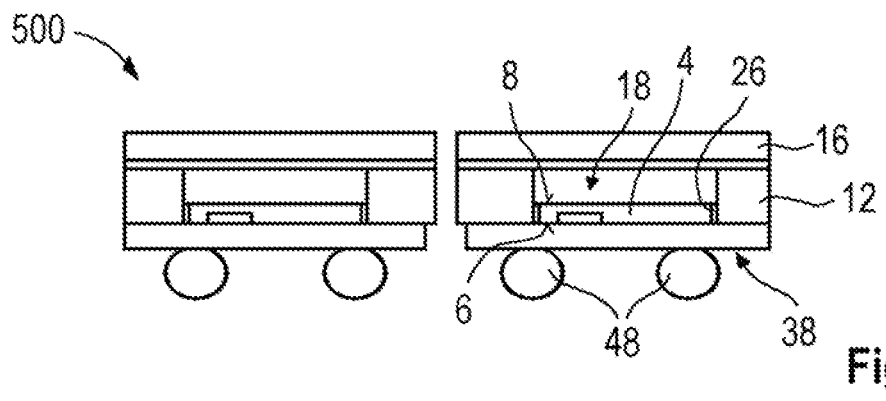

In FIG. 4D, the carrier 32 can be removed and one or more redistribution layers 38 can be fabricated above the active main surfaces 6 of the semiconductor chips 4. The process in FIG. 4D can at least partly correspond to the process in FIG. 3G.

FIGS. 4E to 4H show processes which can be at least partly similar to the processes in FIGS. 3H to 3O. For the sake of simplicity, at this juncture reference is made to the description of FIGS. 3A to 3O. In the process in FIG. 4G, the lid 16 can be additionally thinned using a grinding process.

FIGS. 5A to 5I, which schematically illustrate a cross-sectional side view of a method for producing semiconductor devices 500 in accordance with the disclosure. The method in FIGS. 5A to 5I can be regarded as a more comprehensive implementation of the method in FIGS. 1A to 1D. That is to say that the method illustrated in FIGS. 1A to 1D can be extended by any desired aspects of the method in FIGS. 5A to 5I.

FIGS. 5A to 5I show processes which can be at least partly similar to the processes in FIGS. 3A to 3O. For the sake of simplicity, at this juncture reference is made to the description of FIGS. 3A to 3O. In a manner similar to the semiconductor device 300 in FIG. 3O, the semiconductor device 500 in FIG. 5I can comprise a cavity 18 above the opposite main surface 8 of the semiconductor chip 4. In contrast to FIG. 3O, in the case of the semiconductor device 500 in FIG. 5I, in an orthogonal projection onto the opposite main surface 8 of the semiconductor chip 4, a basic area of the cutout 14 or of the cavity 18 substantially does not project beyond a basic area of the semiconductor chip 4. Rather, in the example in FIG. 5I, the basic areas of the cavity 18 and of the semiconductor chip 4 can be substantially congruent. A slight deviation of the basic areas from one another can be caused by remaining optional residues of the etch stop layer 26 at the sidewalls of the semiconductor chips 4 if such residues should still be present in the finished produced semiconductor device 500.

Figure 6:
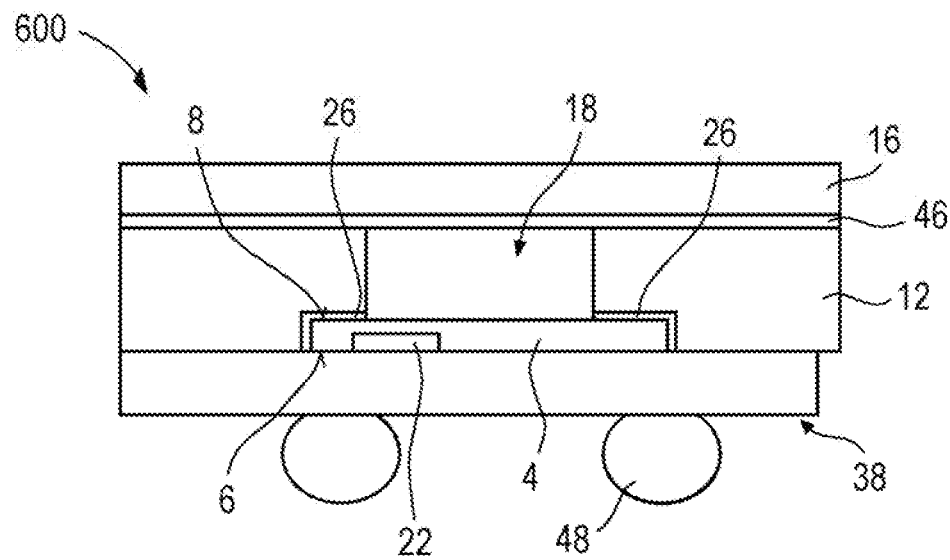
FIG. 6 schematically shows a cross-sectional side view of a semiconductor device 600 in accordance with the disclosure.

FIG. 6 schematically shows a cross-sectional side view of a semiconductor device 600 in accordance with the disclosure. The semiconductor device 600 can be produced for example in accordance with one of the above-described methods in accordance with the disclosure.

The semiconductor device 600 can comprise a semiconductor chip 4 having a first main surface 6 and a second main surface 8 opposite the first main surface 6. The semiconductor chip 4 can be encapsulated by an encapsulation material 12. A cavity 18 can be formed by the encapsulation material 12 and a lid 16 above the opposite main surface 8 of the semiconductor chip 4. In this case, the lid 16 can be secured to the encapsulation material 12 by way of an optional connecting material 46. An electronic structure 22 of the semiconductor chip 4, such as e.g. an electrical contact or an antenna of the semiconductor chip 4, can be electrically connected to external electrical contact elements 48 by way of a redistribution layer 38. Residues of an etch stop layer 26 can be present at the side surfaces and parts of the opposite main surface 8 of the semiconductor chip 4. In an orthogonal projection onto the opposite main surface 8, the basic area of the cavity 18 can be situated completely within the basic area of the semiconductor chip 4. That is to say that in the orthogonal projection the basic area of the cavity 18 cannot project beyond the basic area of the semiconductor chip 4 at any point.

Figure 7:
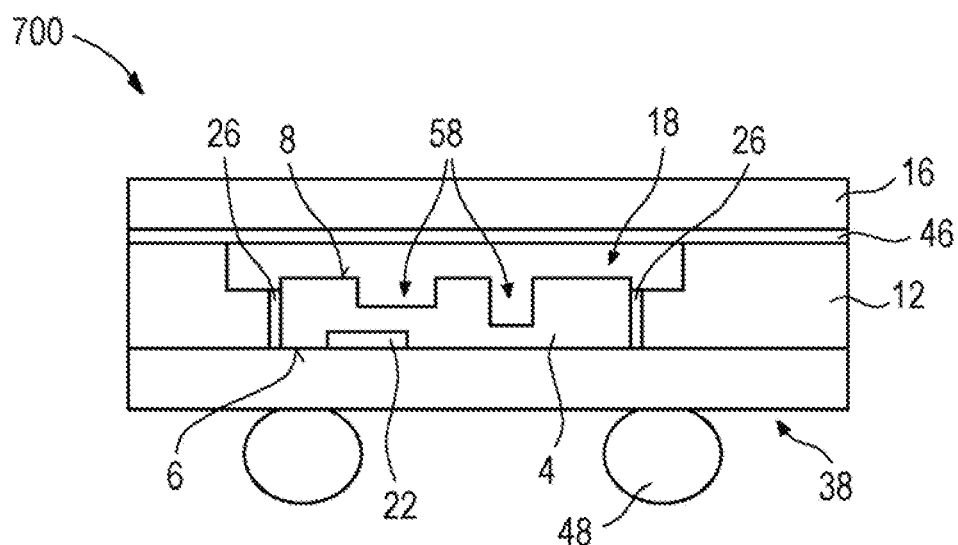
FIG. 7 schematically shows a cross-sectional side view of a semiconductor device 700 in accordance with the disclosure.

FIG. 7 schematically shows a cross-sectional side view of a semiconductor device 700 in accordance with the disclosure. The semiconductor device 700 can be produced for example in accordance with one of the above-described methods in accordance with the disclosure.

The semiconductor device 700 can, for example, be similar to the semiconductor device 300 in FIG. 3O and comprise corresponding components. In addition, the semiconductor device 700 can comprise one or more cutouts 58 formed in the opposite main surface 8 of the semiconductor chip 4 in the semiconductor material of the semiconductor chip 4. In the production method in FIGS. 3A to 3O, the cutouts 58 can be formed for example before or during the process in FIG. 3A, that is to say before the etch stop layer 26 is deposited on the semiconductor chips 4. The cutouts 58 can be formed in the semiconductor material for example using a suitable etching method using an etching mask. The cutouts 58 can have any desired basic areas and identical or different depths. In a manner similar to the cavity 18, the cutouts 58 can prevent a coupling between the semiconductor material of the semiconductor chip 4 and electromagnetic radiation which can be generated or received by electronic structures of the semiconductor chip 4.

Figure 8:
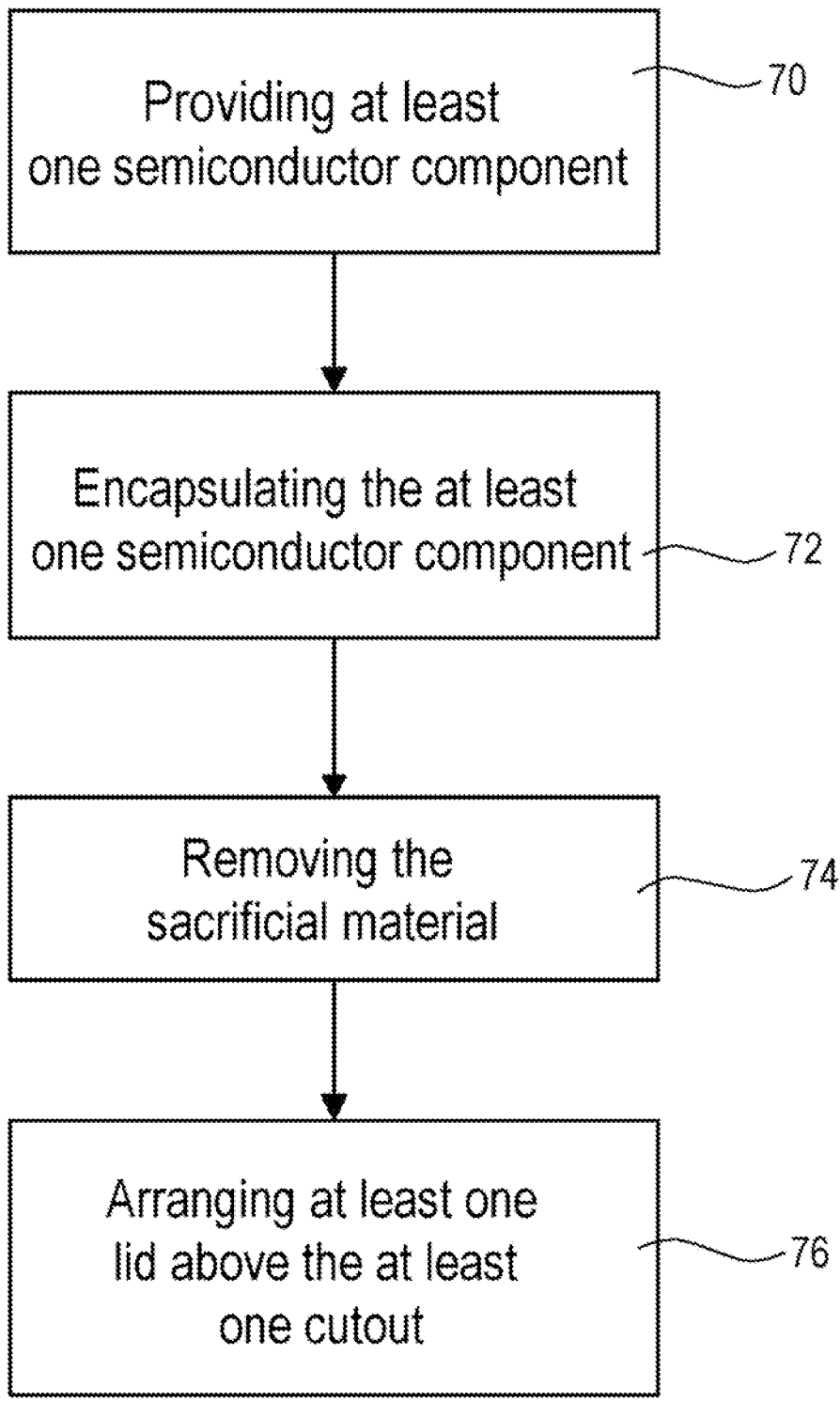
FIG. 8 shows a flow diagram of a method for producing a semiconductor device in accordance with the disclosure.

FIG. 8 shows a flow diagram of a method for producing a semiconductor device in accordance with the disclosure. The method in FIG. 8 may be similar to the method in FIGS. 1A to 1D and be read in conjunction with FIGS. 1A to 1D.

70 involves providing at least one semiconductor component (see FIG. 1A). Each of the at least one semiconductor component comprises a semiconductor chip, wherein the semiconductor chip comprises a first main surface and a second main surface opposite the first main surface. Each of the at least one semiconductor component furthermore comprises a sacrificial material arranged above the opposite second main surface of the semiconductor chip. 72 involves encapsulating the at least one semiconductor component with an encapsulation material (see FIG. 1B). 74 involves removing the sacrificial material, wherein above each of the at least one semiconductor chip a cutout is formed in the encapsulation material (see FIG. 1C). 76 involves arranging at least one lid above the at least one cutout, wherein a closed cavity is formed by the at least one cutout and the at least one lid above each of the at least one semiconductor chip (see FIG. 1D).

Figure 9A:
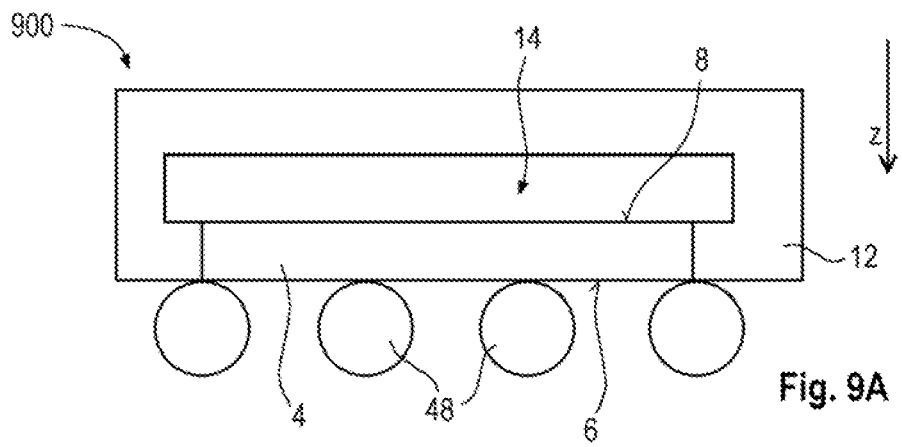
FIGS. 9A and 9B schematically show a cross-sectional side view and a plan view of a semiconductor device 900 in accordance with the disclosure.
Figure 9B:
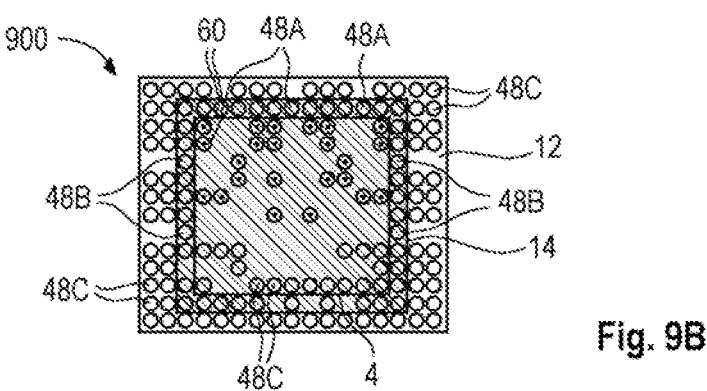

FIGS. 9A and 9B schematically show a cross-sectional side view and a plan view of a semiconductor device 900 in accordance with the disclosure. The semiconductor device 900 may be at least partly similar to the above-described semiconductor devices in accordance with the present disclosure.

The semiconductor device 900 can comprise a semiconductor chip 4 having a first main surface 6 and a second main surface 8 opposite the first main surface 6. The semiconductor chip 4 can be at least partly encapsulated by an encapsulation material 12. A cutout 14 can be arranged in the encapsulation material 12, wherein the cutout 14 is arranged above the opposite main surface 8 of the semiconductor chip 4. The cutout 14 can form a closed cavity, in particular, in which air, for example, can be situated. The cutout 14 is illustrated as a hatched area in the plan view in FIG. 9B.

The semiconductor device 900 can comprise electrical contact elements 48, which can be arranged above the lower main surfaces of the semiconductor chip 4 and/or of the encapsulation material 12. Only a few electrical contact elements 48 are illustrated qualitatively in the cross-sectional side view in FIG. 9A, while the plan view in FIG. 9B shows a more accurate arrangement of the electrical contact elements 48 in the form of small empty circles. The electrical contact elements 48 can comprise one or more transmission (TX) radio-frequency connections 48A, which can be designed to provide radio-frequency transmission signals generated by the semiconductor chip 4. Furthermore, the electrical contact elements 48 can comprise one or more reception (RX) radio-frequency connections 48B, which can be designed to receive radio-frequency reception signals and to forward them to the semiconductor chip 4.

TX radio-frequency connections 48A and four RX radio-frequency connections 48B are shown in the example in FIG. 9B. The number of these connections can deviate therefrom in any desired way in further examples. It is evident from the plan view in FIG. 9B that the TX radio-frequency connections 48A and the RX radio-frequency connections 48B can be arranged above the lower main surface of the encapsulation material 12. In further examples, the connections 48A and 48B can at least partly also be arranged above the lower main surface of the semiconductor chip 4. The electrical contact elements 48 can comprise further connections 48C, which can be for example signal connections for analog and digital signals, ground connections, etc.

The semiconductor device 900 can comprise thermal contact elements 60, which can be designed to dissipate heat from the semiconductor device 900, for example in the direction of a circuit board on which the semiconductor device 900 can be arranged. The thermal contact elements 60 can be so-called "thermo balls", for example. In FIG. 9B, the thermal contact elements 60 are represented by small circles with a dot.

As already explained in association with the previous examples, the semiconductor chip 4 can be a radio-frequency chip. That is to say that the semiconductor chip 4 can comprise one or more regions in which radio-frequency signals are processed or transferred. Such a region of the semiconductor chip 4 can comprise for example at least one from a radio-frequency connection, a radio-frequency line, or an oscillator circuit. In an analogous manner, the encapsulation material 12 can comprise one or more regions in which radio-frequency signals are processed or transferred. By way of example, such a region of the encapsulation material 12 can comprise at least one from a radio-frequency connection or a radio-frequency line. In a projection perpendicular to the first main surface 6 of the semiconductor chip 4 (cf. z-axis), the basic area of the cutout 14 can be arranged above one or more of said regions of the semiconductor chip 4 and/or of the encapsulation material 12 in which radio-frequency signals are processed or transferred.

In the example in FIGS. 9A and 9B, in the projection the basic area of the cutout 14 can at least partly project beyond the basic area of the semiconductor chip 4. It is evident from the plan view in FIG. 9B that the basic area of the semiconductor chip 4 can lie in particular completely within the basic area of the cutout 14. The cutout 14 can be arranged above the TX radio-frequency connections 48A and the RX radio-frequency connections 48B. The material, such as e.g. air, situated in the cutout 14, can have a lower dielectric constant than the encapsulation material 12 and/or the material of the semiconductor chip 4. It is thereby possible to prevent a coupling between these materials and electromagnetic radiation that can be generated by electronic structures of the semiconductor chip 4. In this case, the material in the cutout 14 can be arranged in particular between the TX radio-frequency connections 48A and the RX radio-frequency connections 48B. It is thereby possible to prevent or at least reduce a coupling between the, in particular mutually adjacent, TX and RX channels. A resultant isolation between mutually adjacent TX and RX channels of different semiconductor devices is shown and discussed in connection with FIG. 13. A TX or RX channel can comprise a TX or respectively RX radio-frequency connection 48A and a radio-frequency line electrically connected thereto, which can extend for example on the lower main surface of the encapsulation material 12.

Figure 10A:
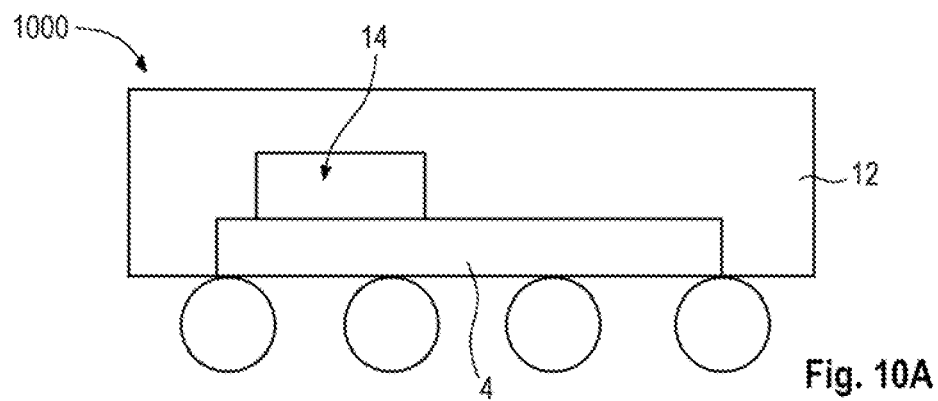
FIGS. 10A and 10B schematically show a cross-sectional side view and a plan view of a semiconductor device 1000 in accordance with the disclosure.
Figure 10B:
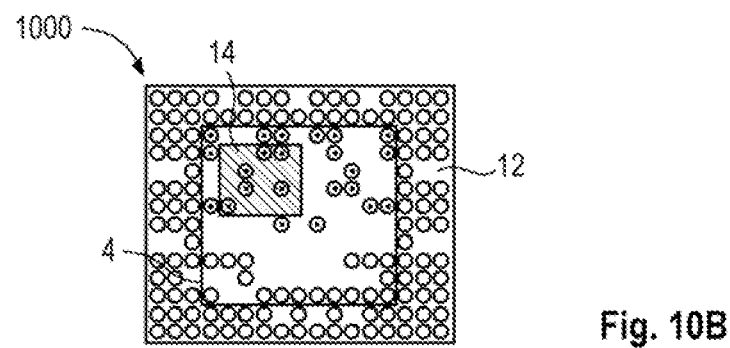

FIGS. 10A and 10B schematically show a cross-sectional side view and a plan view of a semiconductor device 1000 in accordance with the disclosure. The semiconductor device 1000 may for example be similar to the semiconductor device 900 in FIGS. 9A and 9B and comprise corresponding components.

In comparison with FIGS. 9A and 9B, the semiconductor device 1000 in FIGS. 10A and 10B can comprise a cutout 14 of smaller area (cf. FIGS. 9B and 10B). It is evident from FIG. 10B that the basic area of the cutout 14 can be arranged completely within the basic area of the semiconductor chip 4. By way of example, the cutout 14 can be arranged above an oscillator circuit of the semiconductor chip 4, which oscillator circuit can be designed, in particular, to provide radio-frequency signals. In comparison with the semiconductor device 900 in FIGS. 9A and 9B, the semiconductor device 1000, on account of the smaller cutout 14 can have a reduced isolation, but an improved mechanical stability.

Figure 11A:
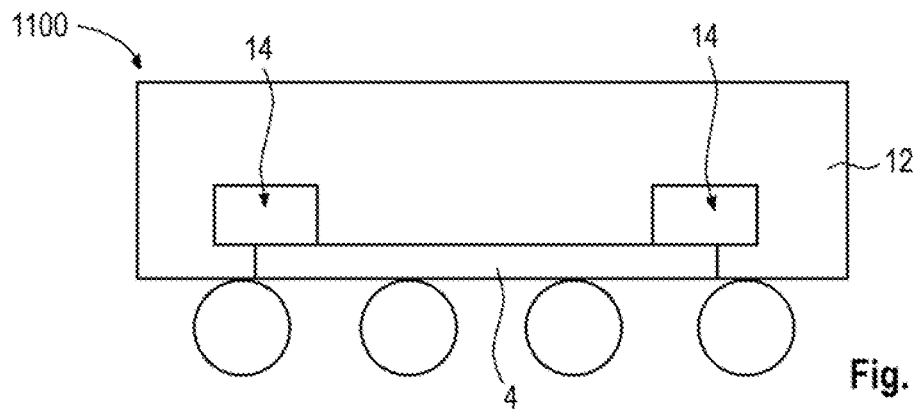
FIGS. 11A and 11B schematically show a cross-sectional side view and a plan view of a semiconductor device 1100 in accordance with the disclosure.
Figure 11B:
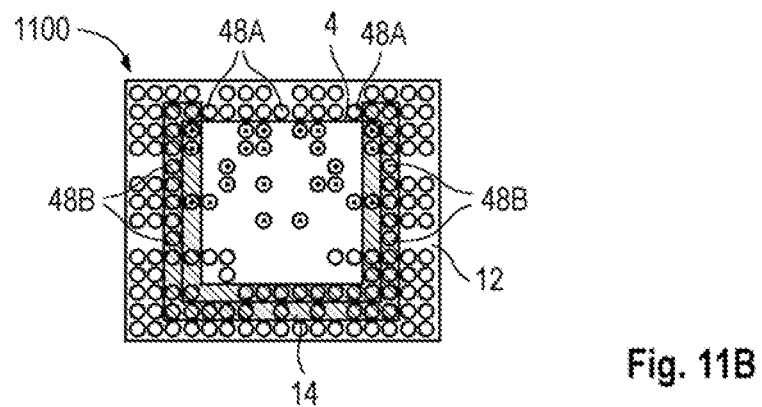

FIGS. 11A and 11B schematically show a cross-sectional side view and a plan view of a semiconductor device 1100 in accordance with the disclosure. The semiconductor device 1100 may for example be similar to the semiconductor device 900 in FIGS. 9A and 9B and comprise corresponding components.

Identically to FIGS. 9A and 9B, the cutout 14 can be arranged above the RX radio-frequency connections 48B, while the TX radio-frequency connections 48A can remain in a manner not covered by the cutout 14. As a result of the arrangement of the cutout 14, mutually adjacent TX and RX channels can be isolated from one another. In the plan view in FIG. 11B, the cutout 14 can be formed in a U-shaped fashion, such that, in comparison with FIGS. 9A and 9B, a larger region above the semiconductor chip 4 remains in a manner not covered by the cutout 14. The semiconductor device 1100 can thus provide an isolation between mutually adjacent TX and RX channels, on the one hand, and have a good mechanical stability, on the other hand.

Figure 12A:
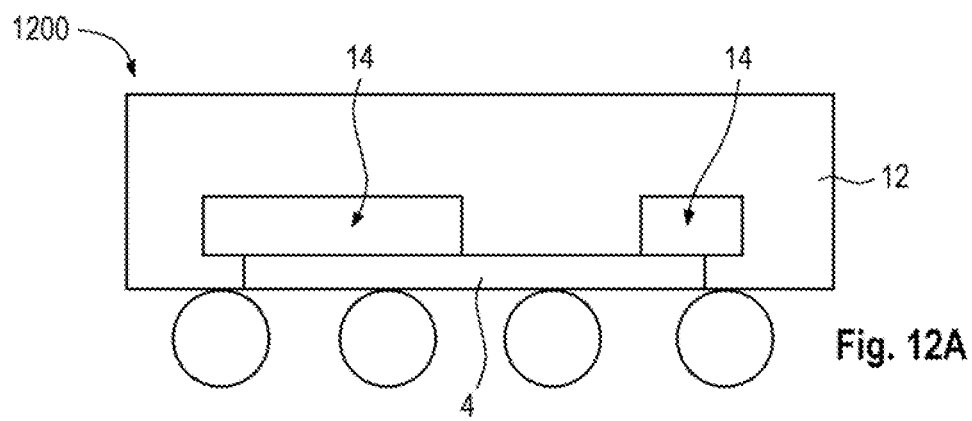
FIGS. 12A and 12B schematically show a cross-sectional side view and a plan view of a semiconductor device 1200 in accordance with the disclosure.
Figure 12B:
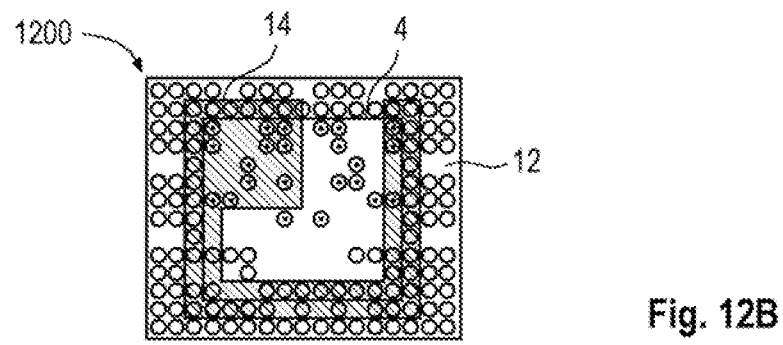

FIGS. 12A and 12B schematically show a cross-sectional side view and a plan view of a semiconductor device 1200 in accordance with the disclosure. The semiconductor device 1200 may for example be similar to the semiconductor device 900 in FIGS. 9A and 9B and comprise corresponding components.

The cutout 14 in FIGS. 12A and 12B can be regarded as a combination of the cutouts 14 in FIGS. 10A to 11B. That is to say that, as a result of the arrangement of the cutout 14, mutually adjacent TX and RX channels can be electrically isolated from one another, and furthermore a part of the cutout 14 can be arranged for example above an oscillator circuit in an inner region of the semiconductor chip 4.

Figure 13:
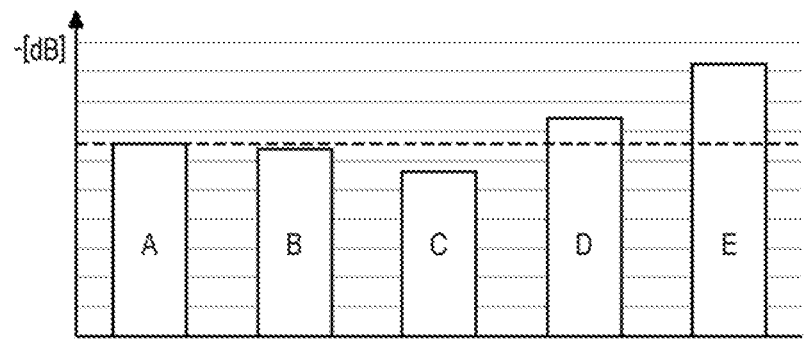
FIG. 13 shows a diagram illustrating the quality of an isolation between a transmission channel and an adjacent reception channel for different semiconductor devices.

FIG. 13 shows a diagram illustrating the quality of an isolation between a transmission channel and an adjacent reception channel or between a TX radio-frequency connection and an adjacent RX radio-frequency connection for different semiconductor devices. Adjacent TX and RX channels are shown for example in FIGS. 9A to 11B. An isolation between the channels is illustrated by bars in FIG. 13, wherein the height of a bar corresponds to a measure of the isolation in units of [−dB]. That is to say that the higher the bar, the better the isolation between the channels.

A bar "A" relates to a semiconductor device, comprising a semiconductor chip having a thickness of approximately 450 micrometers and backside protection (BSP) having a thickness of approximately 25 micrometers. The height of the bar "A" represents a reference value for the isolation between the channels. The reference value is represented by a horizontal dashed line. A bar "B" relates to a semiconductor device, comprising a semiconductor chip having a thickness of approximately 100 micrometers and an encapsulation material cap ("mold cap") having a thickness of approximately 375 micrometers. A bar "C" relates to a semiconductor device, comprising a semiconductor chip having a thickness of approximately 200 micrometers and an encapsulation material cap having a thickness of approximately 275 micrometers. A bar "D" relates to a semiconductor device, comprising a semiconductor chip having a thickness of approximately 100 micrometers and a small cutout or a small cavity in the encapsulation material (cf. e.g. FIGS. 10A and 10B). A bar "E" relates to a semiconductor device, comprising a semiconductor chip having a thickness of approximately 100 micrometers and a large cutout or a large cavity in the encapsulation material (cf. e.g. FIGS. 9A and 9B).

It is evident from the diagram in FIG. 13 that the heights of the bars "D" and "E" lie above the reference value of the bar "A". The semiconductor devices associated with the bars "D" and "E" thus provide the best isolation between the mutually adjacent TX and RX channels.

Figure 14A:
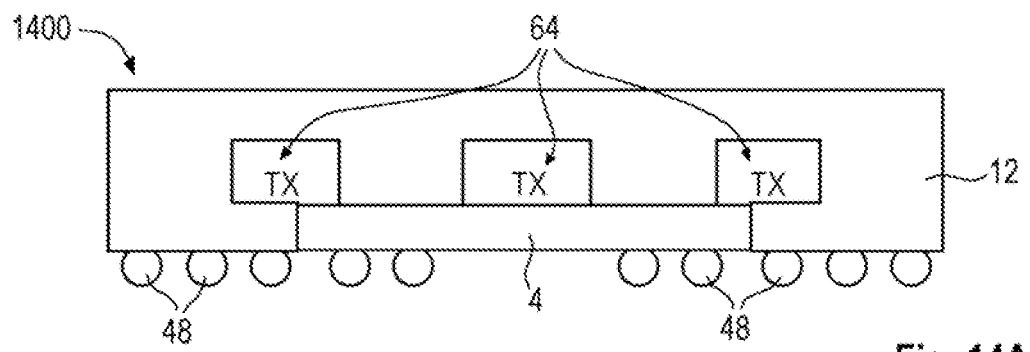
FIGS. 14A and 14B schematically show a cross-sectional side view and a plan view of a semiconductor device 1400 in accordance with the disclosure.
Figure 14B:
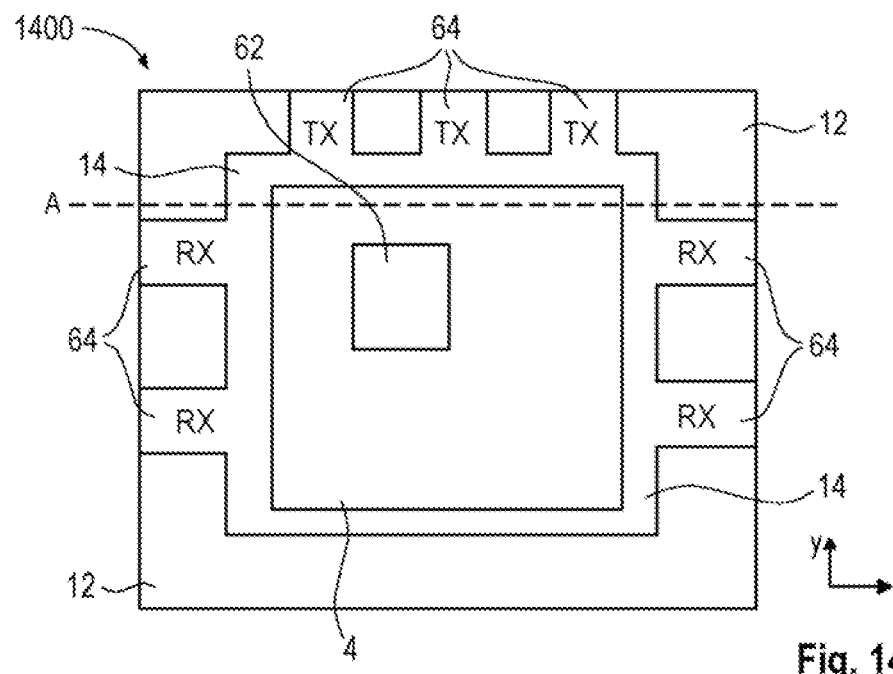

FIGS. 14A and 14B schematically show a cross-sectional side view and a plan view of a semiconductor device 1400 in accordance with the disclosure. In this case, the cross-sectional side view in FIG. 14A is based on a section along a sectional plane "A" and a viewing direction along the y-axis. The sectional plane "A" is indicated by a dashed line in the plan view in FIG. 14B. The semiconductor device 1400 may at least partly be similar to the semiconductor devices in FIGS. 9A to 12B and comprise corresponding components.

The semiconductor device 1400 can comprise one or more openings 64 formed in the encapsulation material 12. In the example in FIGS. 14A and 14B, one or more of the openings 64 can be formed in one or more of the sidewalls of the encapsulation material 12. As an alternative or in addition thereto, one or more of the openings 64 can also be formed in the upper main surface of the encapsulation material 12. In the example in FIGS. 14A and 14B, the semiconductor device 1400 has an opening 64 at each of the TX and RX channels or at each of the TX and RX radio-frequency connections. In a further example, an opening can be positioned at only some of the channels. In yet another example, further openings can additionally be formed alongside the openings illustrated.

The openings 64 can be designed to provide an exchange of air with the cutout 14. To put it more precisely, an exchange of air between the cutout 14 and the atmosphere surrounding the semiconductor device 1400 can take place through the openings. The exchange of air with the cutout 14 can prevent the air humidity of the air situated in the cutout 14 from having an excessively high value. In contrast thereto, air enclosed in a (hermetically) sealed cutout 14 can condense in the event of an excessively high air humidity, which can cause increasing damage to the components of the semiconductor device 1400.

In the plan view in FIG. 14B, the openings 64 can be arranged near regions in which radio-frequency signals are transferred. In particular, the openings 64 can be arranged above at least one from a radio-frequency line and/or a radio-frequency connection. On account of a low dielectric constant of the air situated in the openings 64, it is possible to prevent or at least reduce a coupling of transferred radio-frequency signals into the encapsulation material 12 and also crosstalk between adjacent channels.

In addition to the statements made above, the semiconductor device 1400 can comprise a supporting structure 62 for mechanically stabilizing the semiconductor device 1400. By way of example, the supporting structure 62 can be formed by a part of the encapsulation material 12.

Figure 15A:
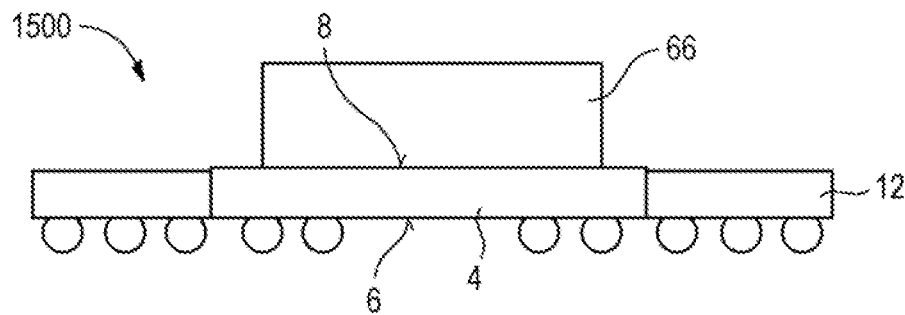
FIGS. 15A and 15B schematically show a cross-sectional side view and a plan view of a semiconductor device 1500 in accordance with the disclosure.
Figure 15B:
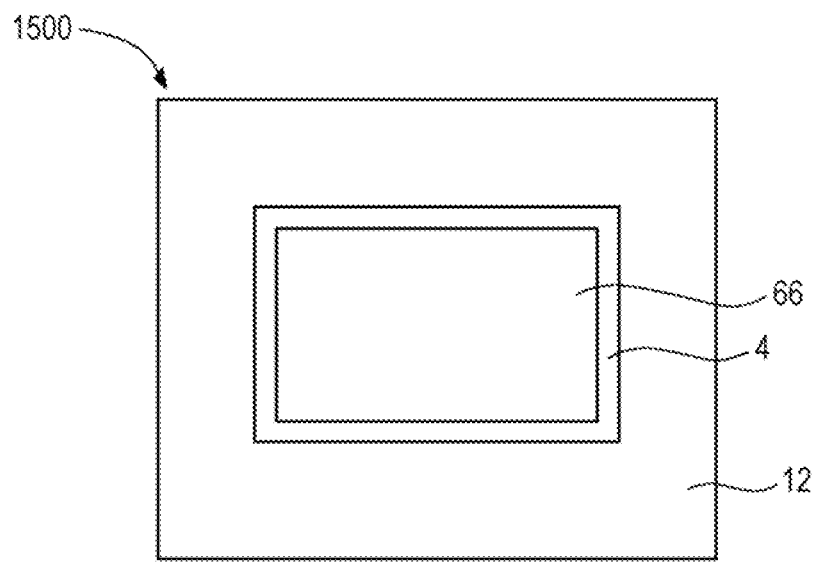

FIGS. 15A and 15B schematically show a cross-sectional side view and a plan view of a semiconductor device 1500 in accordance with the disclosure. The semiconductor device 1500 can at least partly be similar to the above-described semiconductor devices in accordance with the disclosure.

The semiconductor device 1500 can comprise a semiconductor chip 4 having a first main surface 6 and a second main surface 8 opposite the first main surface 6. The semiconductor chip 4 can be at least partly encapsulated by an encapsulation material 12. In the example in FIGS. 15A and 15B, the encapsulation material 12 can cover the side surfaces of the semiconductor chip 4. In further examples, the encapsulation material 12 can additionally be arranged at least partly on the top side of the semiconductor chip 4. The semiconductor device 1500 can furthermore comprise a material 66 arranged above the opposite main surface 8 of the semiconductor chip 4. In a projection perpendicular to the first main surface 6 of the semiconductor chip 4, the material 66 and at least one radio-frequency region of the semiconductor chip 4 and/or of the encapsulation material 12 in which radio-frequency signals are processed or transferred can be free of overlap. In other words, the material 66 can be arranged in particular above regions of the semiconductor chip 4 and/or of the encapsulation material 12 in which no transfer and/or processing of radio-frequency signals takes place.

The thickness of the semiconductor device 1500 can be enlarged by the material 66 formed in the corresponding regions. An improved mechanical stability of the semiconductor device 1500 can be achieved as a result. Furthermore, using a suitable choice of the regions remaining free of the material 66, it is possible to prevent or at least reduce a coupling between, in particular mutually adjacent, radio-frequency regions of the semiconductor chip 4 and/or of the encapsulation material 12. In a projection onto the main surfaces of the semiconductor chip 4, a region free of the material 66 can be arranged between two radio-frequency regions of the semiconductor chip 4 and/or of the encapsulation material 12. By way of example, such a region can be arranged between two radio-frequency channels and be designed to reduce crosstalk between the channels.

The material 66 can comprise or be fabricated from at least one from a molding material, a glass material, a ceramic material, a semiconductor material, a metal, or a metal alloy. A material 66 fabricated from a metal or from a metal alloy can be designed, in particular, to provide dissipation of heat from the semiconductor device 1500 by way of the top side thereof. The material 66 and the encapsulation material 12 can be fabricated from an identical material or from different materials.

The semiconductor device 1500 can be free in particular of cavities in which air having an excessively high air humidity can be enclosed. This makes it possible to avoid condensation and, possibly caused thereby, increasing damage to the components of the semiconductor device 1500.

FIGS. 16 to 20 schematically show plan views of semiconductor devices 1600 to 2000 in accordance with the disclosure. The semiconductor devices 1600 to 2000 can be at least partly similar to the semiconductor device 1500 in FIGS. 15A and 15B and comprise identical components. FIGS. 16 to 20 illustrate by way of example and qualitatively the manner in which the material 66 can be arranged.

Figure 16:
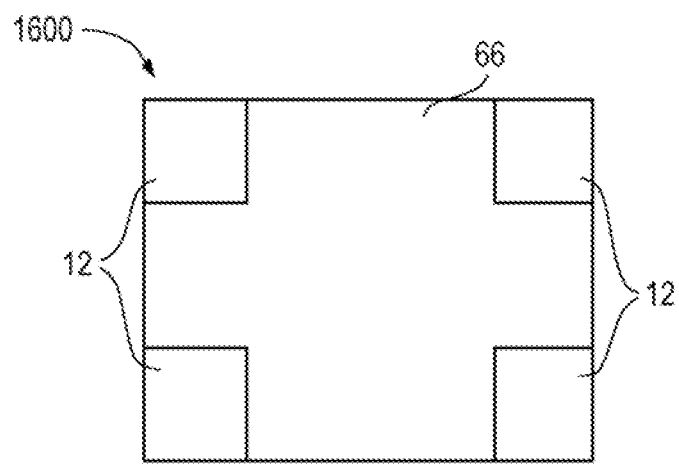
FIG. 16 schematically shows a plan view of a semiconductor device 1600 in accordance with the disclosure.

In the plan view in FIG. 16, the material 66 can substantially be in the shape of a cross, wherein the corners of the semiconductor device 1600 can remain in a manner not covered by the material 66. The regions free of the material 66 can be arranged in each case between adjacent radio-frequency lines or radio-frequency channels (cf. in this respect the arrangement of TX and RX channels in FIGS. 14A and 14B) and be designed to reduce crosstalk between the latter.

Figure 17:
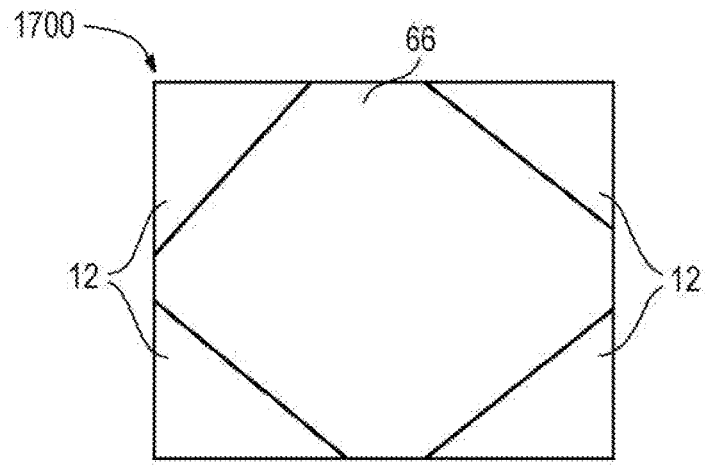
FIG. 17 schematically shows a plan view of a semiconductor device 1700 in accordance with the disclosure.

In the plan view in FIG. 17, the material 66 can be substantially in the shape of a rhombus, wherein the corners of the semiconductor device 1700 can remain in a manner not covered by the material 66. Analogously to FIG. 16, the regions free of the material 66 can be arranged between adjacent radio-frequency lines or radio-frequency channels (cf. in this respect the arrangement of the TX and RX channels in FIGS. 14A and 14B).

Figure 18:
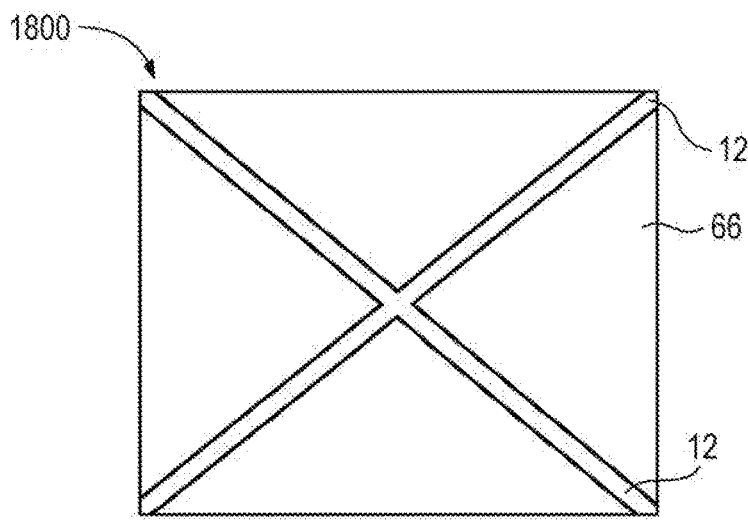
FIG. 18 schematically shows a plan view of a semiconductor device 1800 in accordance with the disclosure.

In the plan view in FIG. 18, the material 66 can be substantially X-shaped, wherein the corners of the semiconductor device 1800 can remain in a manner not covered by the material 66. Analogously to FIG. 16, the regions free of the material 66 can be arranged between adjacent radio-frequency lines or radio-frequency channels (cf. in this respect the arrangement of the TX and RX channels in FIGS. 14A and 14B).

Figure 19:
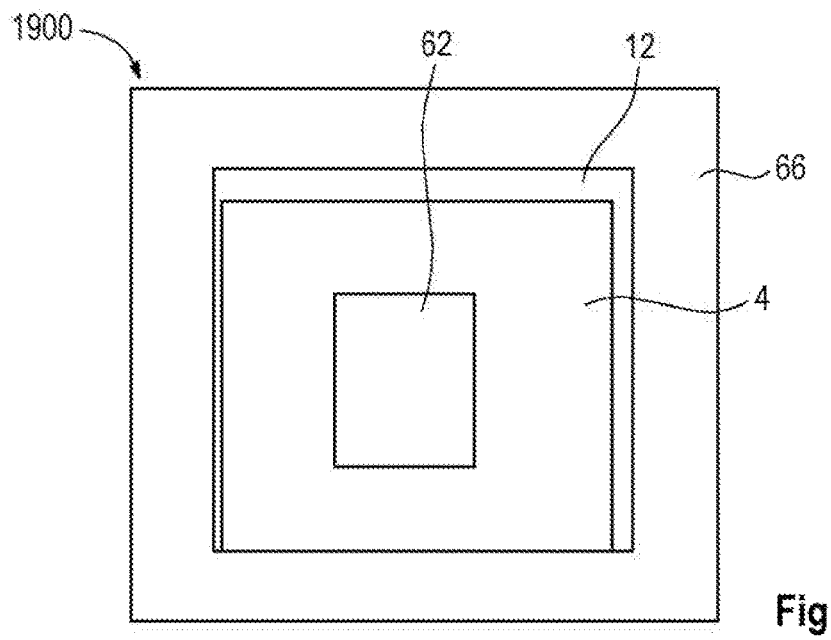
FIG. 19 schematically shows a plan view of a semiconductor device 1900 in accordance with the disclosure.

In the plan view in FIG. 19, the material 66 can have a rectangular frame structure along the edge of the semiconductor device 1900. In a central region, the semiconductor device 1900 can comprise a supporting structure 62 such as has already been discussed in association with FIGS. 14A and 14B. In particular, a mechanical stabilization of the semiconductor device 1900 can be provided by the supporting structure 62 and the material 66.

Figure 20:
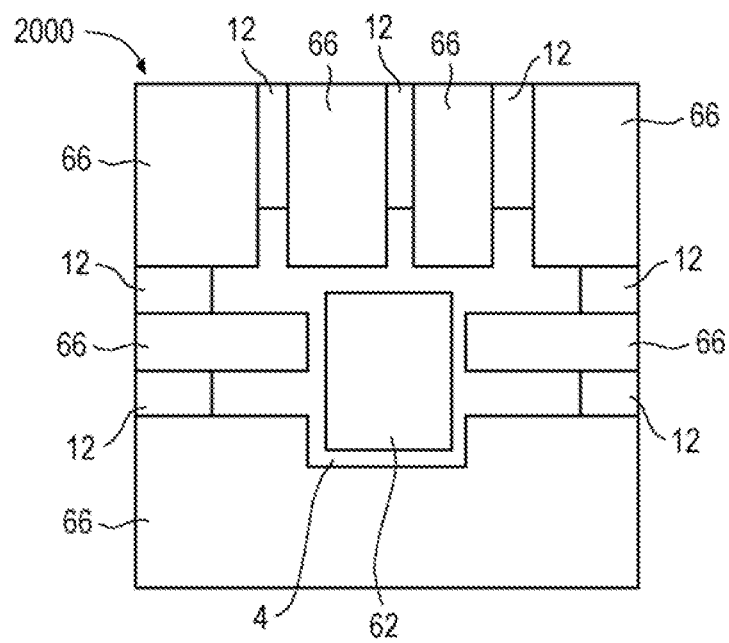
FIG. 20 schematically shows a plan view of a semiconductor device 2000 in accordance with the disclosure.

In the plan view in FIG. 20, the material 66 can be arranged in such a way that regions free of the material 66 can be arranged above radio-frequency lines or radio-frequency channels of the semiconductor device 2000 (cf. in this respect the arrangement of the TX and RX channels in FIGS. 14 and 14B). The semiconductor device 2000 can additionally comprise a supporting structure 62.

Figure 21A:
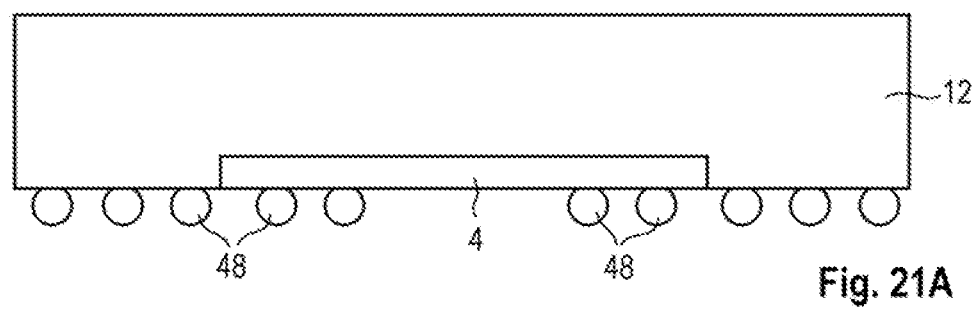
FIGS. 21A and 21B schematically illustrate a cross-sectional side view of a method for producing a semiconductor device 2100 in accordance with the disclosure.
Figure 21B:
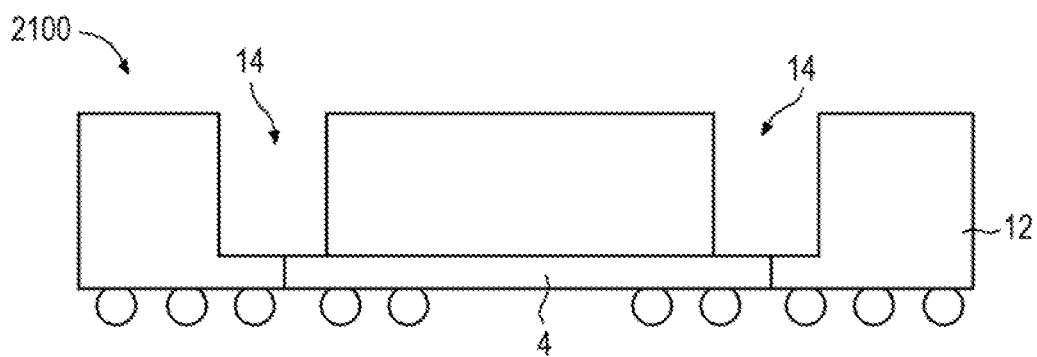

FIGS. 21A and 21B schematically illustrate a cross-sectional side view of a method for producing a semiconductor device 2100 in accordance with the disclosure.

In FIG. 21A, an intermediate product is provided, which may have been produced by previous method steps. These method steps are not shown in FIG. 21A for the sake of simplicity. The intermediate product can comprise a semiconductor chip 4, which can be at least partly encapsulated by an encapsulation material 12. Chip connections (not shown) arranged on the underside of the semiconductor chip 4 can be electrically coupled to electrical contact elements 48 of the intermediate product by way of a redistribution layer (not shown).

In FIG. 21B, one or more cutouts 14 are formed in the top side of the encapsulation material 12. In the example in FIG. 21B, encapsulation material 12 can be removed by the use of a laser, as a result of which the cutouts 14 are formed. As an alternative or in addition thereto, the cutouts 14 can be formed using an etching process. The cutouts 14 can have any desired depth. In particular, the cutouts 14 can extend from the top side of the encapsulation material 12 as far as the top side of the semiconductor chip 4. As already discussed in the previous examples, the cutouts 14 can be arranged in such a way that a coupling between the encapsulation material 12 and electromagnetic radiation of the semiconductor chip 4 can be prevented. Furthermore, it is possible to prevent or at least reduce a coupling between, in particular mutually adjacent, TX and RX channels.

Figure 22:
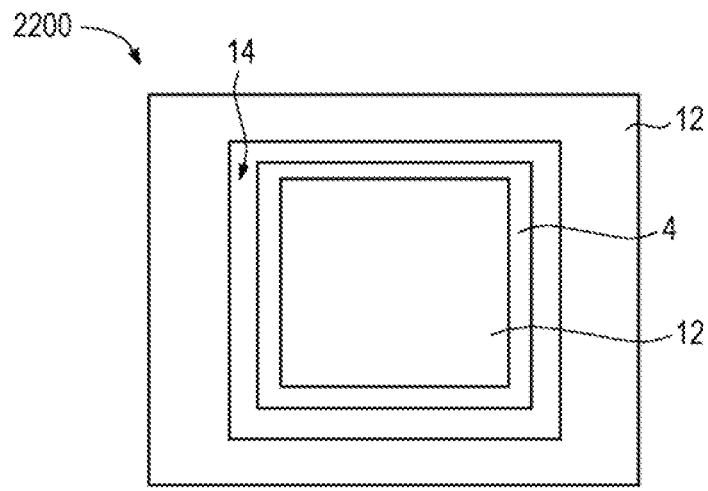
FIG. 22 schematically shows a plan view of a semiconductor device 2200 in accordance with the disclosure.
Figure 23:
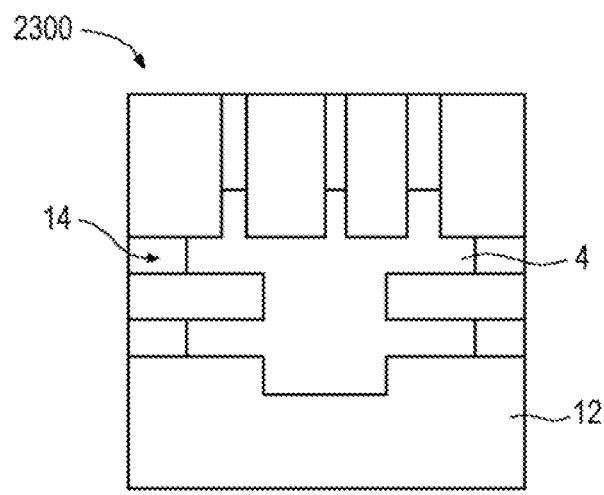
FIG. 23 schematically shows a plan view of a semiconductor device 2300 in accordance with the disclosure.
Figure 24:
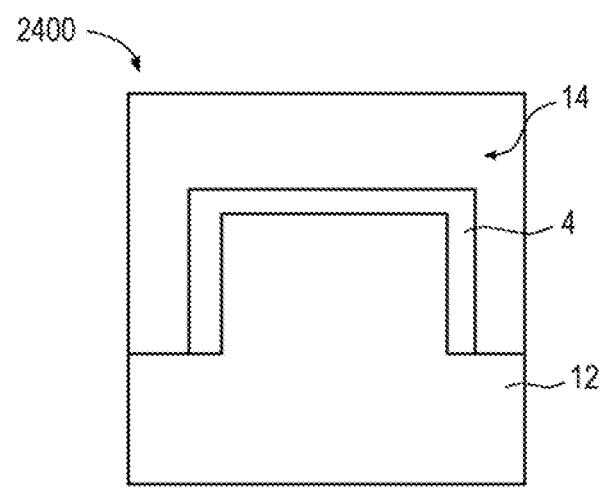
FIG. 24 schematically shows a plan view of a semiconductor device 2400 in accordance with the disclosure.

FIGS. 22 to 24 show plan views of semiconductor devices 2200 to 2400 in accordance with the disclosure. The plan views show example arrangements of cutouts 14 such as can be produced for example by the method in FIGS. 21 and 21B.

The plan view in FIG. 22 shows a semiconductor device 2200, which may be similar in particular to the semiconductor device 2100 in FIGS. 21A and 21B. The cutout 14 can have a rectangular frame structure along the edge of the semiconductor chip 4. In this case, the cutout 14 can be arranged in particular above radio-frequency connections and/or radio-frequency lines arranged in these edge regions.

The semiconductor device 2300 in FIG. 23 may be similar in particular to the semiconductor device 2000 in FIG. 20. The cutouts 14 can be arranged in particular above radio-frequency lines or radio-frequency channels of the semiconductor device 2300 (cf. in this respect the arrangement of the TX and RX channels in FIGS. 14A and 14B).

In the plan view in FIG. 24, the cutout 14 can be formed substantially in a U-shaped fashion. In this case, the cutout 14 in particular can be arranged above radio-frequency connections or radio-frequency lines of the semiconductor device 2400 in the edge regions of the semiconductor chip 4.

EXAMPLES

Semiconductor devices having cutouts in an encapsulation material and associated production methods are explained below on the basis of examples.

Example 1 is a method, comprising: providing at least one semiconductor component, wherein each of the at least one semiconductor component comprises: a semiconductor chip, wherein the semiconductor chip comprises a first main surface and a second main surface opposite the first main surface, and a sacrificial material arranged above the opposite second main surface of the semiconductor chip; encapsulating the at least one semiconductor component with an encapsulation material; removing the sacrificial material, wherein above each of the at least one semiconductor chip a cutout is formed in the encapsulation material; and arranging at least one lid above the at least one cutout, wherein a closed cavity is formed by the at least one cutout and the at least one lid above each of the at least one semiconductor chip.

Example 2 is a method according to example 1, wherein the cavity is arranged above the opposite main surface of the respective semiconductor chip, wherein in an orthogonal projection onto the opposite main surface a basic area of the sacrificial material and a basic area of the cutout at least partly project beyond a basic area of the semiconductor chip.

Example 3 is a method according to example 1 or 2, wherein providing the at least one semiconductor component comprises arranging an etch stop layer between the at least one semiconductor chip and the sacrificial material, and wherein removing the sacrificial material comprises etching the sacrificial material, wherein the etch stop layer is exposed.

Example 4 is a method according to example 3, furthermore comprising: after removing the sacrificial material, removing the etch stop layer, wherein the opposite main surfaces of the at least one semiconductor chip are exposed.

Example 5 is a method according to any of the preceding examples, furthermore comprising: before removing the sacrificial material, removing the encapsulation material above the opposite main surfaces of the at least one semiconductor chip embedded in the encapsulation material, wherein the sacrificial material is exposed.

Example 6 is a method according to any of the preceding examples, wherein after encapsulating the at least one semiconductor component, a main surface of the encapsulation material and the first main surfaces of the at least one semiconductor chip lie in a common plane.

Example 7 is a method according to example 6, furthermore comprising: forming a redistribution layer above the first main surfaces of the at least one semiconductor chip and the main surface of the encapsulation material.

Example 8 is a method according to any of the preceding examples, furthermore comprising: after arranging the at least one lid above the at least one cutout, singulating the at least one semiconductor component encapsulated with the encapsulation material into at least one semiconductor package, wherein each of the at least one semiconductor package comprises one of the cavities.

Example 9 is a method according to any of the preceding examples, wherein the first main surface of the semiconductor chip is an active main surface of the semiconductor chip.

Example 10 is a method according to any of the preceding examples, wherein the sacrificial material comprises a semiconductor material or a glass material.

Example 11 is a method according to any of the preceding examples, furthermore comprising: before providing the at least one semiconductor component, forming at least one cutout in the opposite main surfaces of the at least one semiconductor chip in the semiconductor material of the at least one semiconductor chip.

Example 12 is a method according to any of the preceding examples, wherein providing the at least one semiconductor component comprises: arranging the at least one semiconductor chip on a first carrier, wherein the first main surfaces of the at least one semiconductor chip face the first carrier; arranging an etch stop layer on the opposite main surfaces of the at least one semiconductor chip; arranging the sacrificial material above the etch stop layer; singulating the at least one semiconductor chip, the etch stop layer and the sacrificial material into the at least one semiconductor component; and arranging the at least one semiconductor component on a second carrier, wherein the first main surfaces of the at least one semiconductor chip face the second carrier.

Example 13 is a method according to any of examples 1 to 11, wherein providing the at least one semiconductor component comprises: arranging the at least one semiconductor chip on the sacrificial material, wherein the opposite main surfaces of the at least one semiconductor chip face the sacrificial material, wherein an etch stop layer is arranged between the at least one semiconductor chip and the sacrificial material; and singulating the sacrificial material with the at least one semiconductor chip arranged thereon into the at least one semiconductor component; and arranging the at least one semiconductor component on a second carrier, wherein the first main surfaces of the at least one semiconductor chip face the second carrier.

Example 14 is a device, comprising: a semiconductor chip, comprising a first main surface and a second main surface opposite the first main surface; an encapsulation material, wherein the semiconductor chip is encapsulated by the encapsulation material; and a cutout arranged in the encapsulation material, wherein the cutout is arranged above the opposite main surface of the semiconductor chip, wherein in an orthogonal projection onto the opposite main surface the basic area of the cutout at least partly projects beyond the basic area of the semiconductor chip.

Example 15 is a device according to example 14, furthermore comprising: a lid arranged above the cutout, wherein a closed cavity is formed above the opposite main surface of the semiconductor chip by the cutout and the lid.

Example 16 is a device according to example 14 or 15, wherein the first main surface of the semiconductor chip is an active main surface of the semiconductor chip.

Example 17 is a device according to any of examples 14 to 16, wherein the semiconductor chip comprises an integrated radio-frequency circuit designed to operate at frequencies of greater than 10 GHz.

Example 18 is a device according to any of examples 14 to 17, wherein the lid is fabricated from a molding material and is connected to the encapsulation material.

Example 19 is a device according to any of examples 14 to 18, wherein the opposite main surface of the semiconductor chip is not covered by the encapsulation material.

Example 20 is a device according to any of examples 14 to 19, furthermore comprising: an etch stop layer arranged between a side surface of the semiconductor chip and the encapsulation material.

Example 21 is a device according to any of examples 14 to 20, furthermore comprising: a cutout formed in the opposite main surface of the semiconductor chip in the semiconductor material of the semiconductor chip.

Example 22 is a method, comprising: providing at least one semiconductor component, wherein each of the at least one semiconductor component comprises: a semiconductor chip, wherein the semiconductor chip comprises a first main surface and a second main surface opposite the first main surface, and a sacrificial material arranged above the opposite second main surface of the semiconductor chip; encapsulating the at least one semiconductor component with an encapsulation material; and removing the sacrificial material, wherein above each of the at least one semiconductor chip a cutout is formed in the encapsulation material, wherein the cutout is arranged above the opposite second main surface of the respective semiconductor chip, wherein in an orthogonal projection onto the opposite main surface a basic area of the cutout at least partly projects beyond a basic area of the semiconductor chip.

Example 23 is a device, comprising: a semiconductor chip, comprising a first main surface and a second main surface opposite the first main surface; an encapsulation material, wherein the semiconductor chip is encapsulated by the encapsulation material; a cutout arranged in the encapsulation material, wherein the cutout is arranged above the opposite main surface of the semiconductor chip; and a lid arranged above the cutout, wherein a closed cavity is formed above the opposite main surface of the semiconductor chip by the cutout and the lid.

Example 24 is a device, comprising: a semiconductor chip, comprising a first main surface and a second main surface opposite the first main surface; an encapsulation material, wherein the semiconductor chip is at least partly encapsulated by the encapsulation material; and a cutout arranged in the encapsulation material, wherein the cutout is arranged above the opposite main surface of the semiconductor chip, wherein in a projection perpendicular to the first main surface of the semiconductor chip the basic area of the cutout is arranged above a region of the semiconductor chip and/or of the encapsulation material in which radio-frequency signals are processed or transferred.

Example 25 is a device according to example 24, wherein in the projection the basic area of the cutout projects beyond the basic area of the semiconductor chip.

Example 26 is a device according to example 24, wherein in the projection the basic area of the cutout is arranged completely within the basic area of the semiconductor chip.

Example 27 is a device according to any of examples 24 to 26, wherein in the projection the basic area of the cutout is arranged above at least one from a radio-frequency connection, a radio-frequency line, or an oscillator circuit.

Example 28 is a device according to any of examples 24 to 27, furthermore comprising: at least one opening formed in the encapsulation material and designed to provide an exchange of air with the cutout.

Example 29 is a device according to example 28, wherein the opening is formed in a sidewall of the encapsulation material that is non-parallel to the first main surface of the semiconductor chip.

Example 30 is a device according to example 28 or 29, wherein in the projection the opening is arranged above at least one from a radio-frequency line or a radio-frequency connection.

Example 31 is a device, comprising: a semiconductor chip, comprising a first main surface and a second main surface opposite the first main surface; an encapsulation material, wherein the semiconductor chip is encapsulated by the encapsulation material; and a material arranged above the opposite main surface of the semiconductor chip, wherein in a projection perpendicular to the first main surface of the semiconductor chip the material and at least one radio-frequency region of the semiconductor chip and/or of the encapsulation material in which radio-frequency signals are processed or transferred are free of overlap.

Example 32 is a device according to example 31, wherein in the projection a region free of the material is arranged between two radio-frequency regions of the semiconductor chip and/or of the encapsulation material.

Example 33 is a device according to example 32, wherein the exposed region is designed to reduce crosstalk between two radio-frequency lines.

Example 34 is a device according to any of examples 31 to 33, wherein the material comprises at least one from a molding material, a glass material, a ceramic material, a semiconductor material, a metal, or a metal alloy.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the word "above" used for example with respect to a material layer that is formed "above" a surface of an object or is situated "above" said surface can be used in the present description in the sense that the material layer is arranged (for example formed, deposited, etc.) "directly on", for example in direct contact with, the surface meant. The word "above" used for example with respect to a material layer that is formed or arranged "above" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "example" is used in the present text in the sense that it serves as an example, a case or an illustration. An aspect or a design that is described as "example" in the present text should not necessarily be understood in the sense as though it has advantages over other aspects or designs. Rather, the use of the word "example" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A and B or the like generally means A or B or both A and B.

Devices and methods for producing devices are described in the present text. Observations made in connection with a device described can also apply to a corresponding method, and vice versa. If a specific component of a device is described, for example, then a corresponding method for producing the device can contain a process for providing the component in a suitable manner, even if such a process is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

The invention claimed is:

1. A method, comprising:
   providing a semiconductor component,
      wherein the semiconductor component comprises:
         a semiconductor chip,
            wherein the semiconductor chip comprises a first main surface and
            a second main surface opposite the first main surface, and
         a sacrificial material arranged above the second main surface of the semiconductor chip;
   encapsulating the semiconductor component with a layer of encapsulation material,
      wherein all sidewalls of the semiconductor chip are covered by and in contact with the layer of encapsulation material;
   removing the sacrificial material,
      wherein, above the semiconductor chip, a cutout is formed in the layer of encapsulation material based on removing the sacrificial material,
      wherein an entirety of the second main surface is exposed to gas based on removing the sacrificial material, and
      wherein, in an orthogonal projection onto the second main surface, a basic area of the cutout at least partly projects beyond a basic area of the semiconductor chip; and
   arranging a lid above the cutout,
      wherein a cavity is formed by the cutout and the lid above the semiconductor chip.

2. The method as claimed in claim 1, wherein the cavity is arranged above the second main surface of the semiconductor chip and a surface of the layer of encapsulation material.

3. The method as claimed in claim 1, wherein providing the semiconductor component comprises:
   arranging an etch stop layer between the semiconductor chip and the sacrificial material; and
   wherein removing the sacrificial material comprises:
      etching the sacrificial material, wherein the etch stop layer is exposed.

4. The method as claimed in claim 3, further comprising:
   after removing the sacrificial material, removing the etch stop layer,
      wherein the first main surface and the second main surface of the semiconductor chip are exposed.

5. The method as claimed in claim 1, further comprising:
   before removing the sacrificial material, removing a portion of the layer of encapsulation material above the first main surface and the second main surface of the semiconductor chip embedded in the layer of encapsulation material,
      wherein the sacrificial material is exposed.

6. The method as claimed in claim 1, wherein after encapsulating the semiconductor component, a main surface of the layer of encapsulation material and the first main surface of the semiconductor chip lie in a common plane.

7. The method as claimed in claim 6, further comprising:
   forming a redistribution layer above the first main surface of the semiconductor chip and the main surface of the layer of encapsulation material.

8. The method as claimed in claim 1, further comprising:
   after arranging the lid above the cutout, singulating the semiconductor component encapsulated with the layer of encapsulation material into a semiconductor package,
      wherein the semiconductor package comprises the cavity.

9. The method as claimed in claim 1, wherein the first main surface of the semiconductor chip is an active main surface of the semiconductor chip.

10. The method as claimed in claim 1, wherein the sacrificial material comprises a semiconductor material or a glass material.

11. A device, comprising:
a semiconductor chip, comprising a first main surface and a second main surface opposite the first main surface;
a layer of encapsulation material,
wherein all sidewalls of the semiconductor chip are covered by and in contact with the layer of encapsulation material; and
a cutout arranged in the layer of encapsulation material,
wherein the cutout, in the layer of encapsulation material, is arranged above the second main surface of the semiconductor chip,
wherein an entirety of the second main surface is exposed to a gas, and
wherein, in an orthogonal projection onto the second main surface, a basic area of the cutout, in the layer of encapsulation material, at least partly projects beyond a basic area of the semiconductor chip.

12. The device as claimed in claim 11, further comprising:
a lid arranged above the cutout, in the layer of encapsulation material,
wherein a closed cavity is formed above the second main surface of the semiconductor chip by the cutout, in the layer of encapsulation material, and the lid.

13. The device as claimed in claim 11, wherein the semiconductor chip comprises an integrated radio-frequency circuit designed to operate at frequencies of greater than 10 GHz.

14. The device as claimed in claim 11, wherein the second main surface of the semiconductor chip is not covered by the layer of encapsulation material.

15. The device as claimed in claim 11, further comprising:
a cutout formed in semiconductor material of the second main surface of the semiconductor chip.

16. The device as claimed in claim 11, further comprising:
a lid arranged above the cutout, in the layer of encapsulation material,
wherein a cavity is formed above the second main surface of the semiconductor chip by the cutout, in the layer of encapsulation material, and the lid, and
wherein the cavity includes an opening.

17. A device, comprising:
a semiconductor chip, comprising a first main surface and a second main surface opposite the first main surface;
a layer of encapsulation material,
wherein all sidewalls of the semiconductor chip are covered by and in contact with the layer of encapsulation material; and
a cutout arranged in the layer of encapsulation material,
wherein the cutout, in the layer of encapsulation material, is arranged above the second main surface of the semiconductor chip,
wherein an entirety of the second main surface is exposed to a gas, and
wherein, in a projection perpendicular to the first main surface of the semiconductor chip, a basic area of the cutout, in the layer of encapsulation material, is arranged above a region of the semiconductor chip and a region of the layer of encapsulation material in which radio-frequency signals are processed or transferred.

18. The device as claimed in claim 17, wherein, in the projection, the basic area of the cutout, in the layer of encapsulation material, projects beyond a basic area of the semiconductor chip.

19. The device as claimed in claim 17, wherein, in the projection, the basic area of the cutout, in the layer of encapsulation material, is arranged above at least one of a radio-frequency connection, a radio-frequency line, or an oscillator circuit.

20. The device as claimed in claim 17, further comprising:
an opening formed in the layer of encapsulation material and designed to provide an exchange of the gas with the cutout in the layer of encapsulation material.

21. The device as claimed in claim 20, wherein, in the projection, the opening is arranged above at least one of a radio-frequency line or a radio-frequency connection.

22. A device, comprising:
a semiconductor chip, comprising a first main surface and a second main surface opposite the first main surface;
a layer of encapsulation material;
an etch stop material arranged between sidewalls of the semiconductor chip and the layer of encapsulation material,
wherein all sidewalls of the semiconductor chip are covered by and in contact with the etch stop material; and
a cutout arranged in the layer of encapsulation material above the second main surface of the semiconductor chip,
wherein an entirety of the second main surface is exposed to a gas, and
wherein, in a projection perpendicular to the first main surface of the semiconductor chip, a basic area of the cutout, in the layer of encapsulation material, at least partly projects beyond a basic area of the semiconductor chip.

23. The device as claimed in claim 17, further comprising:
a material in the cutout in the layer of encapsulation material,
wherein the material in the cutout, in the layer of encapsulation material, has a lower dielectric constant than at least one of:
the layer of encapsulation material, or
the semiconductor chip.

24. The device as claimed in claim 22, further comprising:
a lid arranged above the cutout, in the layer of encapsulation material,
wherein a cavity is formed above the second main surface of the semiconductor
chip by the cutout, in the layer of encapsulation material, and the lid, and
wherein the cavity includes an opening.

25. The device as claimed in claim 22, further comprising:
a lid arranged above the cutout, in the layer of encapsulation material,
wherein a closed cavity is formed above the second main surface of the semiconductor chip by the cutout, in the layer of encapsulation material, and the lid.

* * * * *